United States Patent
Yamamoto

(10) Patent No.: US 10,992,890 B2
(45) Date of Patent: Apr. 27, 2021

(54) SOLID STATE IMAGING DEVICE, SIGNAL PROCESSING DEVICE, AND ELECTRONIC APPARATUS HAVING PIXEL SHARING UNITS AND COLOR FILTER CODING UNITS

(71) Applicant: SONY SEMICONDUCTOR SOLUTIONS CORPORATION, Kanagawa (JP)

(72) Inventor: Atsuhiko Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/586,026

(22) Filed: Sep. 27, 2019

(65) Prior Publication Data
US 2020/0029056 A1    Jan. 23, 2020

Related U.S. Application Data

(63) Continuation of application No. 14/523,621, filed on Oct. 24, 2014, now Pat. No. 10,462,430.

(30) Foreign Application Priority Data

Oct. 31, 2013  (JP) ................................ 2013-226299

(51) Int. Cl.
*H04N 5/367* (2011.01)
*H04N 9/04* (2006.01)
*H01L 27/146* (2006.01)
*H04N 5/365* (2011.01)

(52) U.S. Cl.
CPC ....... *H04N 5/367* (2013.01); *H01L 27/14621* (2013.01); *H01L 27/14641* (2013.01); *H04N 5/3653* (2013.01); *H04N 9/045* (2013.01); *H01L 27/14643* (2013.01)

(58) Field of Classification Search
CPC ...... H04N 9/045; H04N 5/3653; H04N 5/367; H01L 27/14621; H01L 27/14641; H01L 27/14643
See application file for complete search history.

(56) References Cited

U.S. PATENT DOCUMENTS

| | | | |
|---|---|---|---|
| 2011/0049590 A1* | 3/2011 | Itonaga | H01L 27/14641 257/292 |
| 2013/0182154 A1* | 7/2013 | Kimura | H04N 5/3742 348/272 |
| 2014/0027613 A1* | 1/2014 | Smith | H04N 5/2352 250/208.1 |

* cited by examiner

Primary Examiner — Gevell V Selby
(74) *Attorney, Agent, or Firm* — Sheridan Ross P.C.

(57) ABSTRACT

A solid state imaging device includes: a group of a plurality of pixels configured to include pixels of the same color coding and with no pixel sharing between each other; and a color filter that is formed by Bayer arrangement of the group of a plurality of pixels.

20 Claims, 24 Drawing Sheets

SOLID STATE IMAGING DEVICE, SIGNAL PROCESSING DEVICE, AND ELECTRONIC APPARATUS HAVING PIXEL SHARING UNITS AND COLOR FILTER CODING UNITS

CROSS REFERENCE TO RELATED APPLICATIONS

This application is a continuation of U.S. patent application Ser. No. 14/523,621, filed Oct. 24, 2014, which claims the benefit of Japanese Priority Patent Application JP 2013-226299 filed on Oct. 31, 2013, the entire contents of which are incorporated herein by reference.

FIELD

The present disclosure relates to a solid state imaging device, a signal processing device, and an electronic apparatus, and in particular, to a solid state imaging device, a signal processing device, and an electronic apparatus capable of suppressing resolution degradation in white point correction.

BACKGROUND

In the same pixel sharing type solid state imaging device, when color filters of four pixels of the same color are attached, the same color coding has been performed by the same pixel sharing (refer to JP 2010-28423 A).

CITATION LIST

Patent Literature

[PTL 1]
JP 2010-28423 A

SUMMARY

Technical Problem

However, when a white point is generated due to leakage of a floating diffusion portion in a pixel sharing portion or the like, for example, the white point is corrected using four pixels of the same color that are separated by two pixels from the white point. In this case, the position of each pixel used in correction is spatially separated from the position of a pixel to be corrected. For this reason, the resolution after correction has often been degraded.

It is desirable to suppress resolution degradation in white point correction.

Solution to Problem

A solid state imaging device of a first aspect of the present technology includes: a group of a plurality of pixels configured to include pixels of the same color coding and with no pixel sharing between each other; and a color filter that is formed by Bayer arrangement of the group of a plurality of pixels.

The group of a plurality of pixels includes pixels with no pixel sharing between each other.

A unit of the pixel sharing is 2×2 pixels.

At least a half of the group of a plurality of pixels is pixels with no pixel sharing between each other.

A unit of the pixel sharing is 2×4 pixels.

A unit of the pixel sharing is 1×4 pixels.

A defective pixel generated in a unit of the pixel sharing is corrected using pixels in the group of a plurality of pixels.

The group of a plurality of pixels includes four pixels.

The color coding is a coding of primary color checker.

The color coding is a coding of WRGB.

A signal processing device of a second aspect of the present technology includes: a correction processing unit that corrects a defective pixel generated in a pixel sharing unit, in an output signal output from a solid state imaging device including a group of a plurality of pixels configured to include pixels of the same color coding and with no pixel sharing between each other and a color filter formed by Bayer arrangement of the group of a plurality of pixels, using pixels in the group of a plurality of pixels.

The correction processing unit may correct a defective pixel generated in the pixel sharing unit using pixels in the group of a plurality of pixels according to the number of defective pixels generated in the pixel sharing unit.

The correction processing unit may correct a defective pixel generated in the pixel sharing unit using all pixels in the group of a plurality of pixels.

The correction processing unit may correct a defective pixel generated in the pixel sharing unit using data in the group of a plurality of pixels according to storage time of the defective pixel generated in the pixel sharing unit.

An electronic apparatus of a third aspect of the present technology includes: a solid state imaging device that includes a group of a plurality of pixels configured to include pixels of the same color coding and with no pixel sharing between each other and a color filter formed by Bayer arrangement of the group of a plurality of pixels; an optical system that makes incident light be incident on the solid state imaging device; and a signal processing circuit that processes an output signal output from the solid state imaging device.

According to the first aspect of the present technology, the solid state imaging device includes a group of a plurality of pixels configured to include pixels of the same color coding and with no pixel sharing between each other and a color filter formed by Bayer arrangement of the group of a plurality of pixels.

According to the second aspect of the present technology, in the output signal output from the solid state imaging device including a group of a plurality of pixels configured to include pixels of the same color coding and with no pixel sharing between each other and the color filter formed by Bayer arrangement of the group of a plurality of pixels, a defective pixel generated in the pixel sharing unit is corrected using pixels in the group of a plurality of pixels.

According to the third aspect of the present technology, the solid state imaging device includes a group of a plurality of pixels configured to include pixels of the same color coding and with no pixel sharing between each other and the color filter formed by Bayer arrangement of the group of a plurality of pixels. In addition, incident light is incident on the solid state imaging device, and the output signal output from the solid state imaging device is processed.

Advantageous Effects of Invention

According to an embodiment of the present technology, it is possible to perform white point correction. In addition, according to an embodiment of the present technology, it is possible to suppress resolution degradation in white point correction.

The effect described in this specification is for illustrative, and the effect of the present technology is not limited to the effect described in this specification, and there may be an additional effect.

DETAILED DESCRIPTION

Hereinafter, modes for carrying out the present disclosure (hereinafter, referred to as embodiments) will be described. In addition, the explanation will be given in the following order.

0. Example of the schematic configuration of a solid state imaging device
1. First embodiment (example of 2×2 pixel sharing)
2. Second embodiment (example of 2×4 pixel sharing)
3. Third embodiment (example of 1×4 pixel sharing)
4. Fourth embodiment (another example of the configuration of a solid state imaging device)
5. Fifth embodiment (computer)

0. Example of the Schematic Configuration of a Solid State Imaging Device

<Example of the Schematic Configuration of a Solid State Imaging Device>

Figure 1:
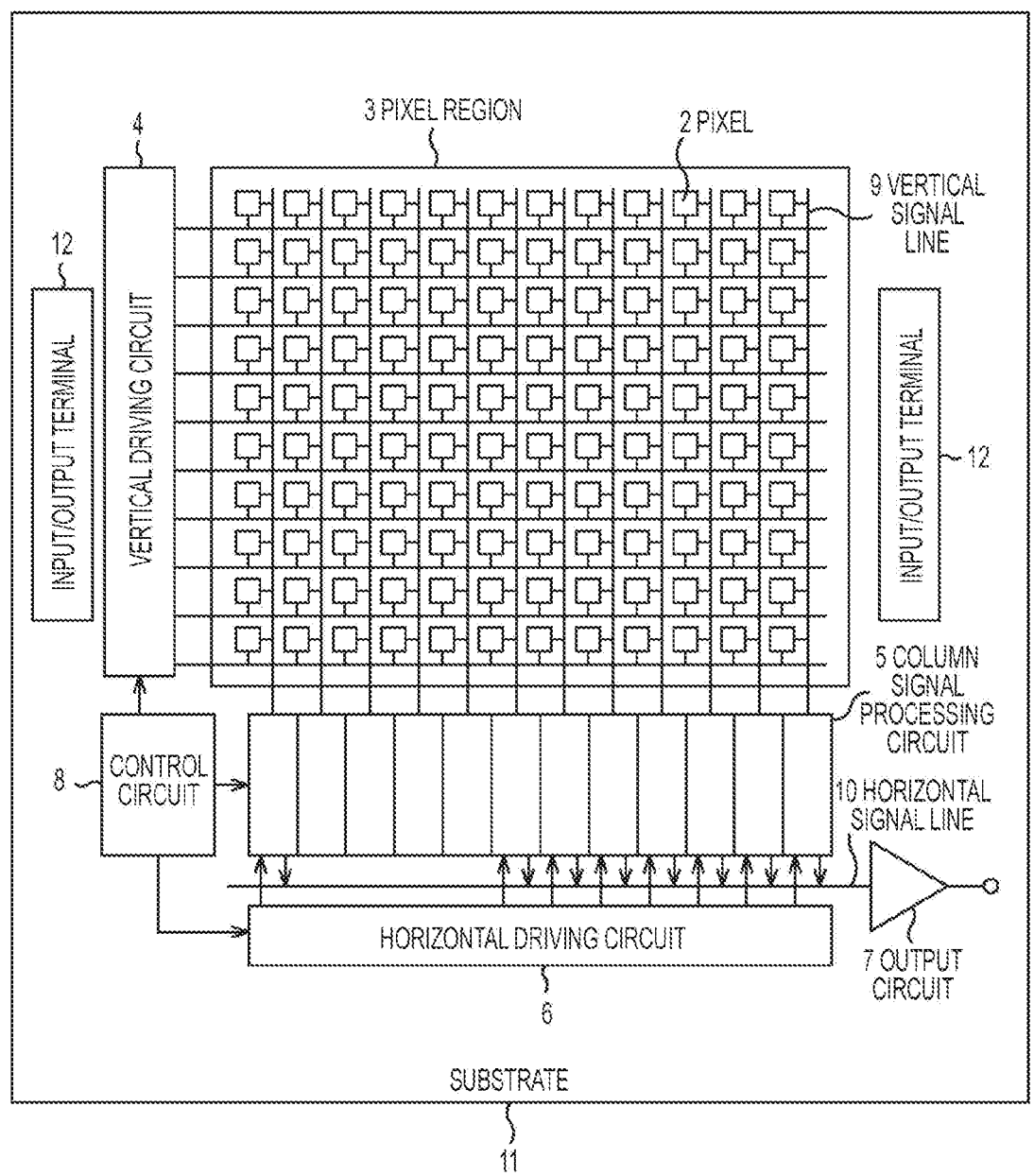
FIG. 1 is a block diagram showing an example of the schematic configuration of a solid state imaging device to which the present technology is applied.

FIG. 1 shows an example of the schematic configuration of a CMOS (Complementary Metal Oxide Semiconductor) solid state imaging device applied to each embodiment of the present technology.

As shown in FIG. 1, a solid state imaging device (element chip) 1 includes a pixel region (so-called imaging region) 3, in which a plurality of pixels 2 including photoelectric conversion elements are regularly arrayed in a two-dimensional manner on a semiconductor substrate 11 (for example, a silicon substrate), and a peripheral circuit portion.

The pixel 2 includes a photoelectric conversion element (for example, a photodiode) and a plurality of pixel transistors (so-called MOS transistors). For example, the plurality of pixel transistors can be three transistors of a transfer transistor, a reset transistor, and an amplifier transistor, or can be four transistors by adding a selection transistor. Since an equivalent circuit of each pixel 2 (unit pixel) is the same as a typical one, detailed explanation thereof will be omitted herein.

The pixel 2 can be formed so as to have a pixel sharing structure. As will be described later with reference to FIG. 3, a pixel sharing structure includes a plurality of photodiodes, a plurality of transfer transistors, one floating diffusion that is shared, and every other pixel transistor that is shared, for example.

The peripheral circuit portion includes a vertical driving circuit 4, a column signal processing circuit 5, a horizontal driving circuit 6, an output circuit 7, and a control circuit 8.

The control circuit 8 receives an input clock or data designating the operation mode or the like, and outputs data, such as the internal information of the solid state imaging device 1. Specifically, the control circuit 8 generates a control signal or a clock signal as a reference of the operation of the vertical driving circuit 4, the column signal processing circuit 5, and the horizontal driving circuit 6 based on a vertical synchronization signal, a horizontal synchronization signal, and a master clock. Then, the control circuit 8 inputs these signals to the vertical driving circuit 4, the column signal processing circuit 5, and the horizontal driving circuit 6.

The vertical driving circuit 4 is formed by a shift register, for example, and selects a pixel driving wiring line and supplies a pulse for driving the pixel 2 to the selected pixel driving wiring line to drive the pixel 2 in units of a row.

Specifically, the vertical driving circuit 4 selects and scans each pixel 2 of the pixel region 3 sequentially in a vertical direction in units of a row, and supplies a pixel signal based on a signal charge, which is generated according to the amount of received light in the photoelectric conversion element of each pixel 2, to the column signal processing circuit 5 through a vertical signal line 9.

The column signal processing circuit 5 is disposed for each column of the pixel 2, for example, and performs signal processing, such as noise removal, on the signal output from the pixel 2 of one row for each pixel column. Specifically, the column signal processing circuit 5 performs signal processing, such as CDS (Correlated Double Sampling) for removing fixed pattern noise unique to the pixel 2, signal amplification, or A/D (Analog/Digital) conversion. A horizontal selection switch (not shown) is provided between the output end of the column signal processing circuit 5 and a horizontal signal line 10.

The horizontal driving circuit 6 is formed by a shift register, for example, and selects the column signal processing circuits 5 in order by sequentially outputting horizontal scanning pulses and outputs a pixel signal, which is output from each of the column signal processing circuits 5, to the horizontal signal line 10.

The output circuit 7 performs signal processing on the signals, which are sequentially supplied from the column signal processing circuits 5 through the horizontal signal line 10, and outputs the result. For example, the output circuit 7 may perform only buffering, or may perform black level adjustment, column variation correction, various kinds of digital signal processing, and the like.

An input/output terminal 12 is provided to transmit a signal to the outside and receive a signal from the outside.

<Example of a Cross Section of a Solid State Imaging Device>

Figure 2:
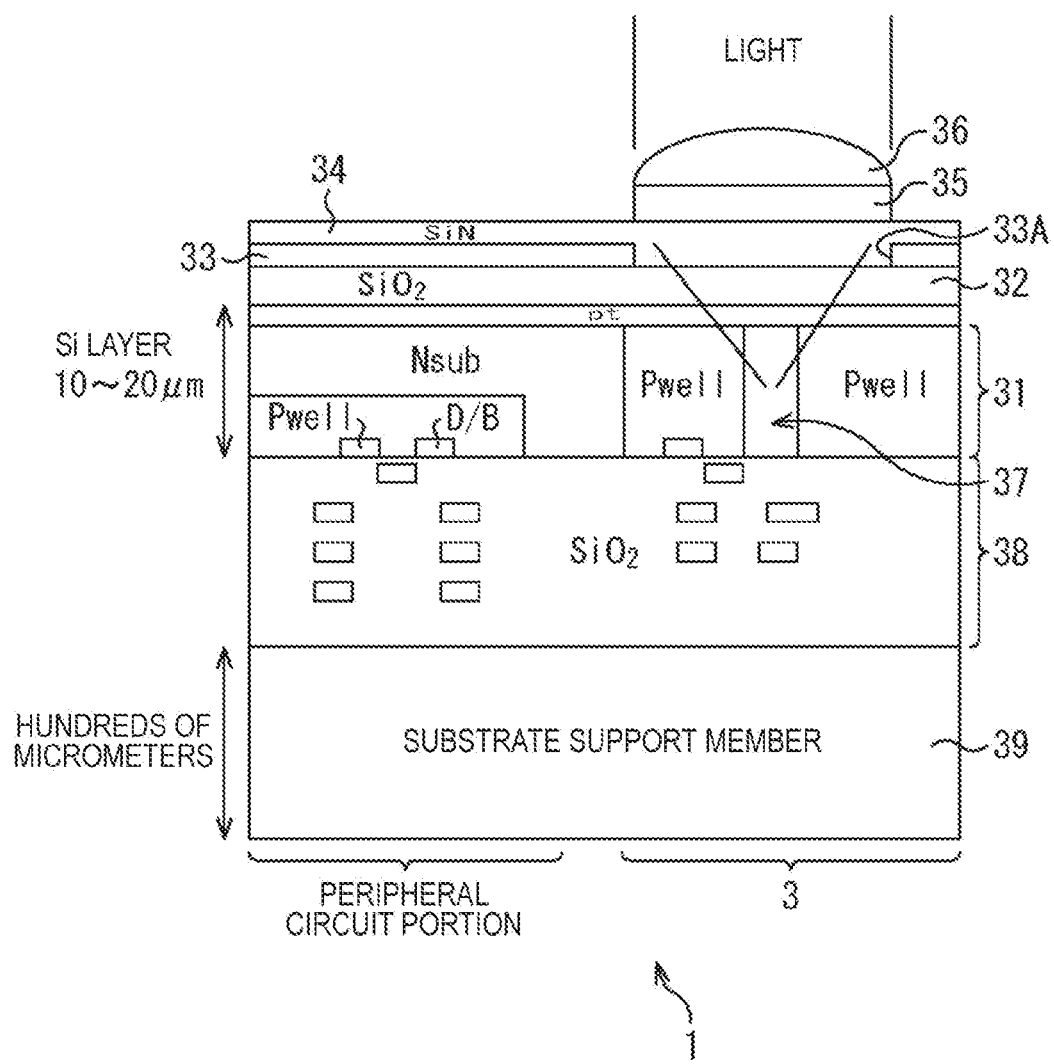
FIG. 2 is a cross-sectional view of a solid state imaging device according to an embodiment of the present technology.

FIG. 2 is a cross-sectional view showing an example of the structure of the pixel region 3 and the peripheral circuit portion of a solid state imaging device. In the example shown in FIG. 2, an example of a bottom surface emission type solid state imaging device is shown.

In the solid state imaging device 1 of the example shown in FIG. 2, an Si (silicon) layer (element layer) 31 having a thickness of about 10 μm to 20 μm is formed by polishing a wafer by CMP (Chemical Mechanical Polishing). A preferable range of the thickness is 5 μm to 15 μm in the case of visible light, 5 μm to 50 μm in the case of infrared light, and 3 μm to 7 μm in the case of ultraviolet light. A light shielding layer 33 is formed on one surface of the Si layer 31 with an SiO$_2$ layer 32 interposed therebetween.

Unlike the wiring line, the light shielding layer 33 is laid out in consideration of only optical elements. An opening 33A is formed in the light shielding layer 33. A silicon nitride layer (SiN) 34 as a passivation layer is formed on the light shielding layer 33, and a color filter 35 and an OCL (On Chip Lens) 36 is further formed above the opening 33A.

That is, the above is a pixel structure in which light incident from one surface side of the Si layer 31 is guided to the light receiving surface of a photodiode 37, which is formed in the Si layer 31, through the OCL 36 and the color filter 35. A wiring layer 38, in which a transistor or a metal wiring line is formed, is formed on the other surface of the Si layer 31, and a substrate support member 39 is bonded to the wiring layer 38.

1. First Embodiment (Example of 2×2 Pixel Sharing)

<Example of the Configuration of a Pixel Sharing Unit>

Figure 3:
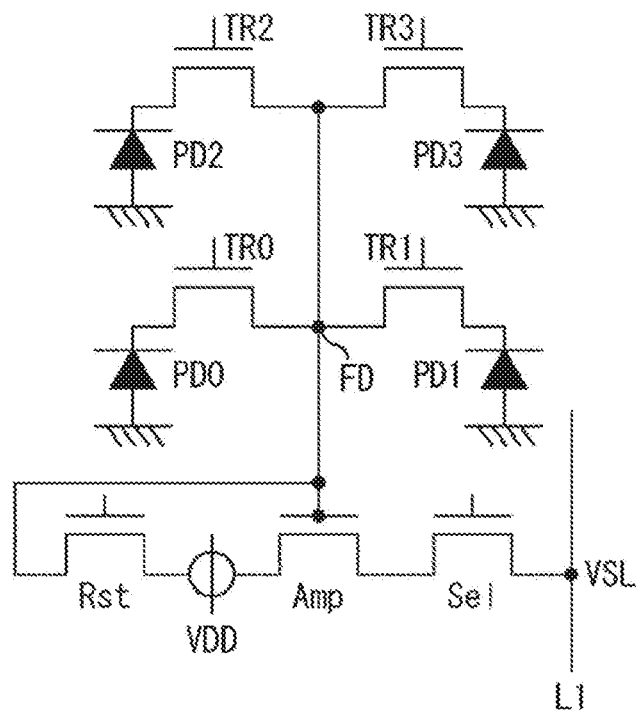
FIG. 3 is a circuit diagram showing an example of the circuit configuration of a 2×2 pixel sharing unit.
Figure 4:
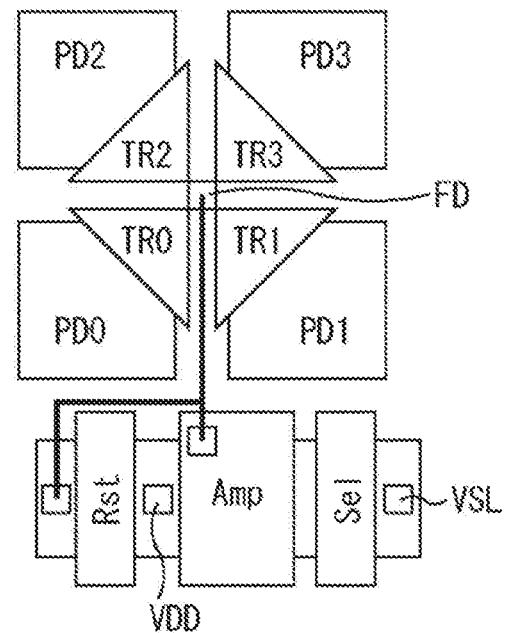
FIG. 4 is a plan view showing an example of the circuit configuration of the 2×2 pixel sharing unit.

First, an example of the circuit configuration of a 2×2 pixel sharing unit will be described with reference to FIGS. 3 and 4. FIG. 3 is a circuit diagram showing an example of the circuit configuration of the 2×2 pixel sharing unit. FIG. 4 is a plan view showing an example of the circuit configuration of the 2×2 pixel sharing unit.

As shown in FIGS. 3 and 4, the 2×2 pixel sharing unit is configured to include four photoelectric conversion elements, for example, photodiodes PD0 to PD3, four transfer transistors TR0 to TR3 corresponding to the photodiodes PD0 to PD3, and three transistors of a reset transistor Rst, an amplifier transistor Amp, and a selection transistor Sel.

The photodiodes PD0 to PD3 have anode electrodes connected to the negative power supply (for example, ground), and perform photoelectric conversion of received light into optical charges (here, photoelectrons) of the amount of electric charges corresponding to the amount of received light. Cathode electrodes of the photodiodes PD0 to PD3 are electrically connected to a gate electrode of the amplifier transistor Amp through the corresponding transfer transistors TR0 to TR3. A node at which the gate electrode of the amplifier transistor Amp is electrically connected to the four transfer transistors TR0 to TR3 is referred to as a floating diffusion FD.

The transfer transistors TR0 to TR3 are connected between the cathode electrodes of the corresponding photodiodes PD0 to PD3 and the floating diffusion FD. A high-level (for example, a VDD level) active (hereinafter, referred to as "High active") transfer pulse φTRF is applied to gate electrodes of the transfer transistors TR0 to TR3 through a transfer line (not shown). By applying the transfer pulse φTRF, the transfer transistors TR0 to TR3 are turned on, and optical charges generated by photoelectric conversion in the photodiodes PD0 to PD3 are transferred to the floating diffusion FD.

The reset transistor Rst has a drain electrode connected to a pixel power supply VDD and a source electrode connected to the floating diffusion FD. A High active reset pulse φRST is applied to the gate electrode of the reset transistor Rst through a reset line (not shown) before the transfer of signal charges from the photodiodes PD0 to PD3 to the floating diffusion FD. The reset transistor Rst is turned on by applying the reset pulse φRST, and the floating diffusion FD is reset by discarding the electric charges of the floating diffusion FD to the pixel power supply VDD.

The amplifier transistor Amp has a gate electrode connected to the floating diffusion FD and a drain electrode connected to the pixel power supply VDD. In addition, the amplifier transistor Amp outputs the electric potential of the floating diffusion FD after the reset by the reset transistor Rst as a reset signal (reset level) Vreset. In addition, the amplifier transistor Amp outputs, as a light accumulation signal (signal level) Vsig, the electric potential of the floating diffusion FD after transferring signal charges by the transfer transistors TR0 to TR3.

The selection transistor Sel has a drain electrode connected to the source electrode of the amplifier transistor Amp and a source electrode connected to a vertical signal line L1, for example. A High active selection pulse φSEL is applied to a gate electrode of the selection transistor Sel through a selection line (not shown). By applying the selection pulse φSEL, the selection transistor Sel is turned on to select a unit pixel, and a signal output from the amplifier transistor Amp is relayed to the vertical signal line L1.

In addition, the selection transistor Sel may also be connected between the pixel power supply VDD and the drain of the amplifier transistor Amp.

<Relationship Between a Pixel Sharing Unit and a CF Coding Unit>

Figure 5:
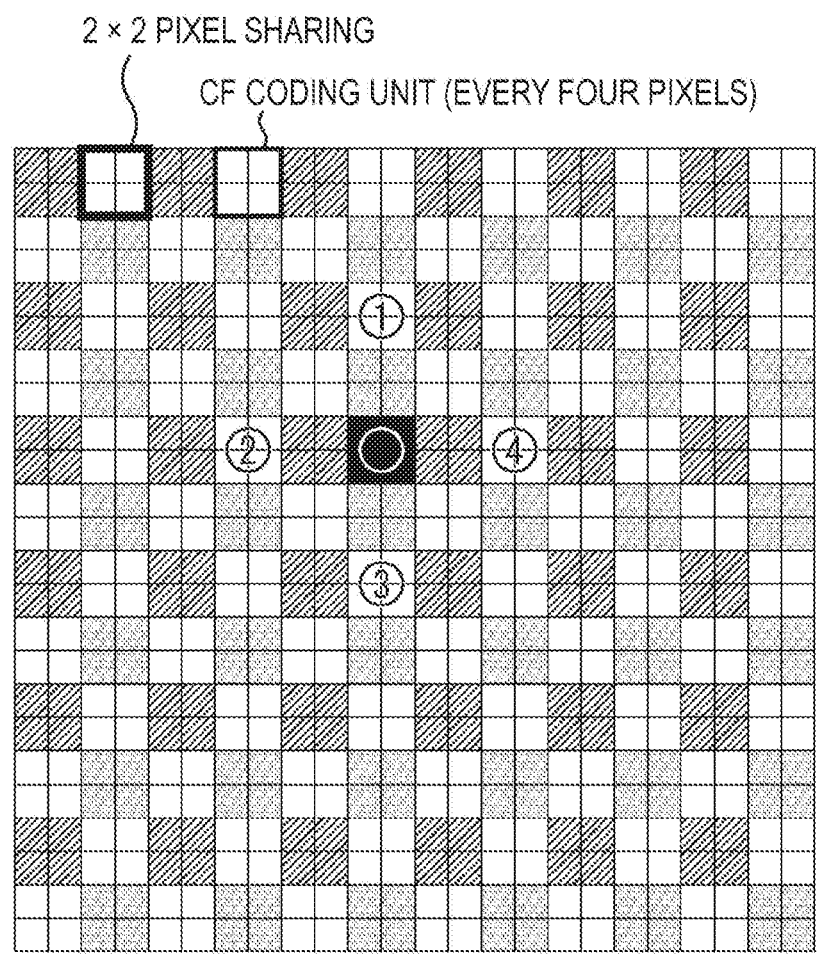
FIG. 5 is a diagram showing an example of the relationship between a 2×2 pixel sharing unit and a coding unit of a color filter.

FIG. 5 is a diagram showing the relationship between a 2×2 pixel sharing unit and a coding unit of a color filter (CF). In the example shown in FIG. 5, no hatch indicates a green pixel, a diagonal hatch indicates a red pixel, and the remaining hatch indicates a blue pixel. This is the same in other diagrams below. In the example shown in FIG. 5, an example of 2×2 pixel sharing is shown by the heavy line, and an example in which RGB checker coding (Bayer array) of the same color filter has been performed every four pixels is shown by the solid line.

That is, in the example shown in FIG. 5, the pixel sharing unit and the coding unit of the same color filter correspond to each other in a one-to-one manner, and respective pixels of 2×2 pixels of the pixel sharing unit are coded with the same color filter.

Therefore, when a white point is generated in a black 2×2 pixel portion at the center due to leakage of the floating diffusion or the like, it can be considered to correct a green pixel using green pixels disposed at the most peripheral positions shown by the numbers of 1 to 4 in FIG. 5. That is, in the example shown in FIG. 5, the green pixel is corrected using data that is spatially separated by two pixels in the unit pixel.

<Relationship Between a CF Coding Unit and a Pixel Sharing Unit of the Present Technology>

Figure 6:
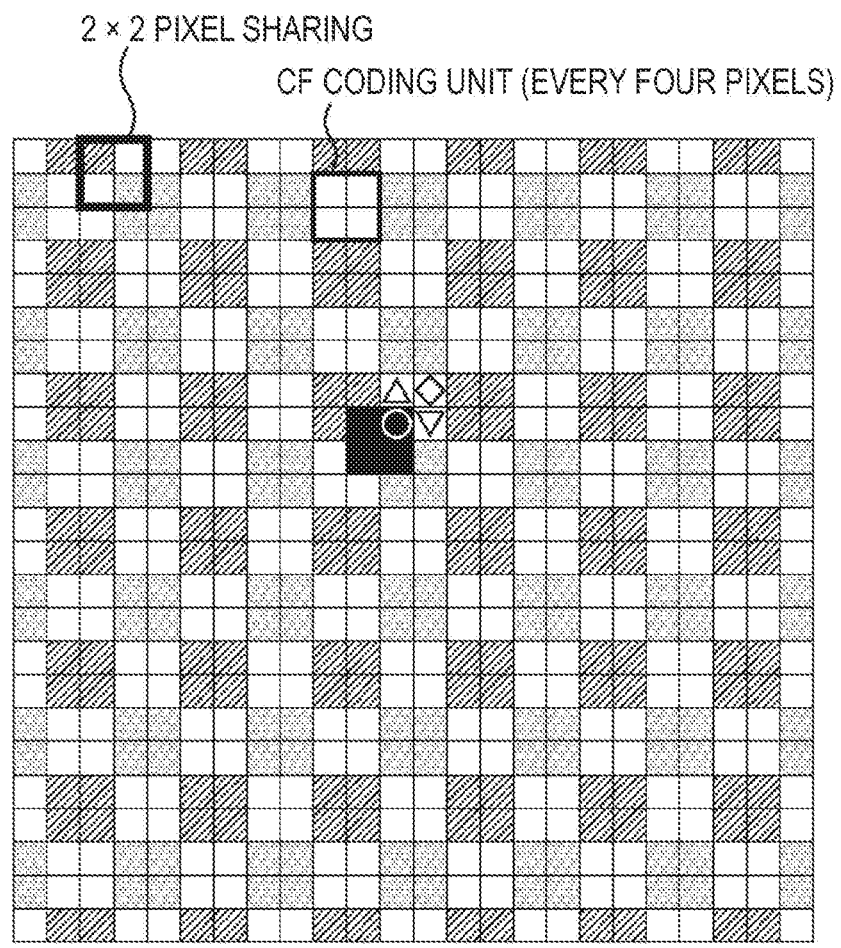
FIG. 6 is a diagram showing the relationship between a coding unit of a color filter and a 2×2 pixel sharing unit according to an embodiment of the present technology.

FIG. 6 is a diagram showing the relationship between a coding unit of a color filter (CF) and a pixel sharing unit to which the present technology is applied. In the example shown in FIG. 6, an example of 2×2 pixel sharing is shown by the heavy line, and an example in which RGB checker coding (Bayer array) of the same color filter has been performed every four pixels is shown by the solid line.

In the example shown in FIG. 6, respective pixels of 2×2 pixels of the pixel sharing unit are coded with different color filters, as shown by the heavy line. In other words, four pixels of the coding unit of the same color filter are formed of pixels of different pixel sharing units. That is, four pixels of the coding unit of the same color filter (hereinafter, appropriately referred to as four adjacent pixels of the same color) are formed of pixels with no pixel sharing between each other.

In addition, the color filter 35 shown in FIG. 6 is formed by moving the color filter shown in FIG. 5 by one pixel upward and by one pixel rightward, for example.

Thus, when a white point is generated in a black pixel portion at the center due to leakage of the floating diffusion or the like, the correction of, for example, a green pixel indicated by a circle in the black pixel portion is performed using at least one of green pixels, which are indicated by a triangle, a rhombus, and an inverted triangle, of the coding unit of the same green color filter. For the correction, any one of the green pixels indicated by the triangle, the rhombus, and the inverted triangle may be used, or two or all of the green pixels may be used.

That is, in the example shown in FIG. 6, pixels used in correction are adjacent pixels. Therefore, since the correction can be performed with spatially close data, it is possible to suppress resolution degradation more than in the example shown in FIG. 5.

Hereinafter, a pixel correction method when a white point is generated will be specifically described.

<Example of the Configuration of an Electronic Apparatus>

Figure 7:
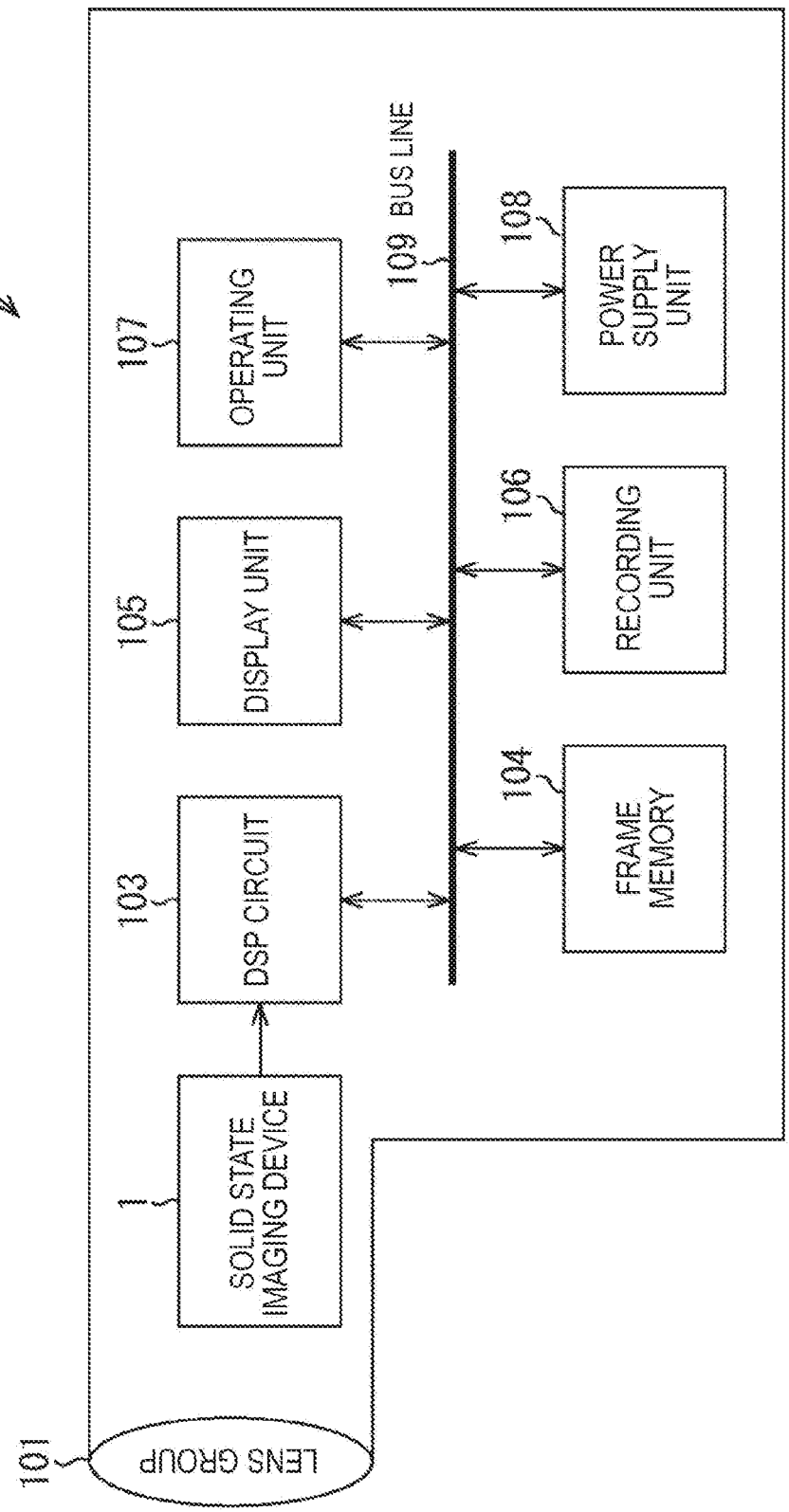
FIG. 7 is a block diagram showing an example of the configuration of an electronic apparatus according to an embodiment of the present technology.

FIG. 7 is a block diagram showing an example of the configuration of a camera apparatus as an electronic apparatus to which the present technology is applied. In the electronic apparatus shown in FIG. 7, the correction described above is performed when a white point is generated.

A camera apparatus 100 shown in FIG. 7 includes an optical unit 101 including a lens group and the like, a solid state imaging device (imaging device) 1 in which the configuration of each pixel 2 shown in FIG. 1 is adopted, and a DSP (Digital Signal Processor) circuit 103 that is a camera signal processing circuit. In addition, the camera apparatus 100 includes a frame memory 104, a display unit 105, a recording unit 106, an operating unit 107, and a power supply unit 108. The DSP circuit 103, the frame memory 104, the display unit 105, the recording unit 106, the operating unit 107, and the power supply unit 108 are connected to each other through a bus line 109.

The optical unit 101 receives incident light (image light) from a subject and forms an image on the imaging surface of the solid state imaging device 1. The solid state imaging device 1 converts the amount of incident light formed on the imaging surface by the optical unit 101, in units of a pixel, into an electric signal, outputs the electric signal as a pixel signal. The DSP circuit 103 corrects the signal output from the output circuit 7 shown in FIG. 1 when a white point due to leakage of the floating diffusion described above is generated. The DSP circuit 103 stores the corrected signal in the frame memory 104, for example.

The display unit 105 is formed by a panel type display device, for example, a liquid crystal panel or an organic EL (ElectroLuminescence) panel, and displays a moving image or a still image captured by the solid state imaging device 1. The recording unit 106 records a moving image or a still image captured by the solid state imaging device 1 on a recording medium, such as a video tape or a DVD (Digital Versatile Disk).

The operating unit 107 issues an operation command for various functions of the camera apparatus 100 under the operation of the user. The power supply unit 108 appropriately supplies various kinds of power, which are the operation power of the DSP circuit 103, the frame memory 104, the display unit 105, the recording unit 106, and the operating unit 107, to these.

<Example of the Configuration of a DSP Circuit>

Figure 8:
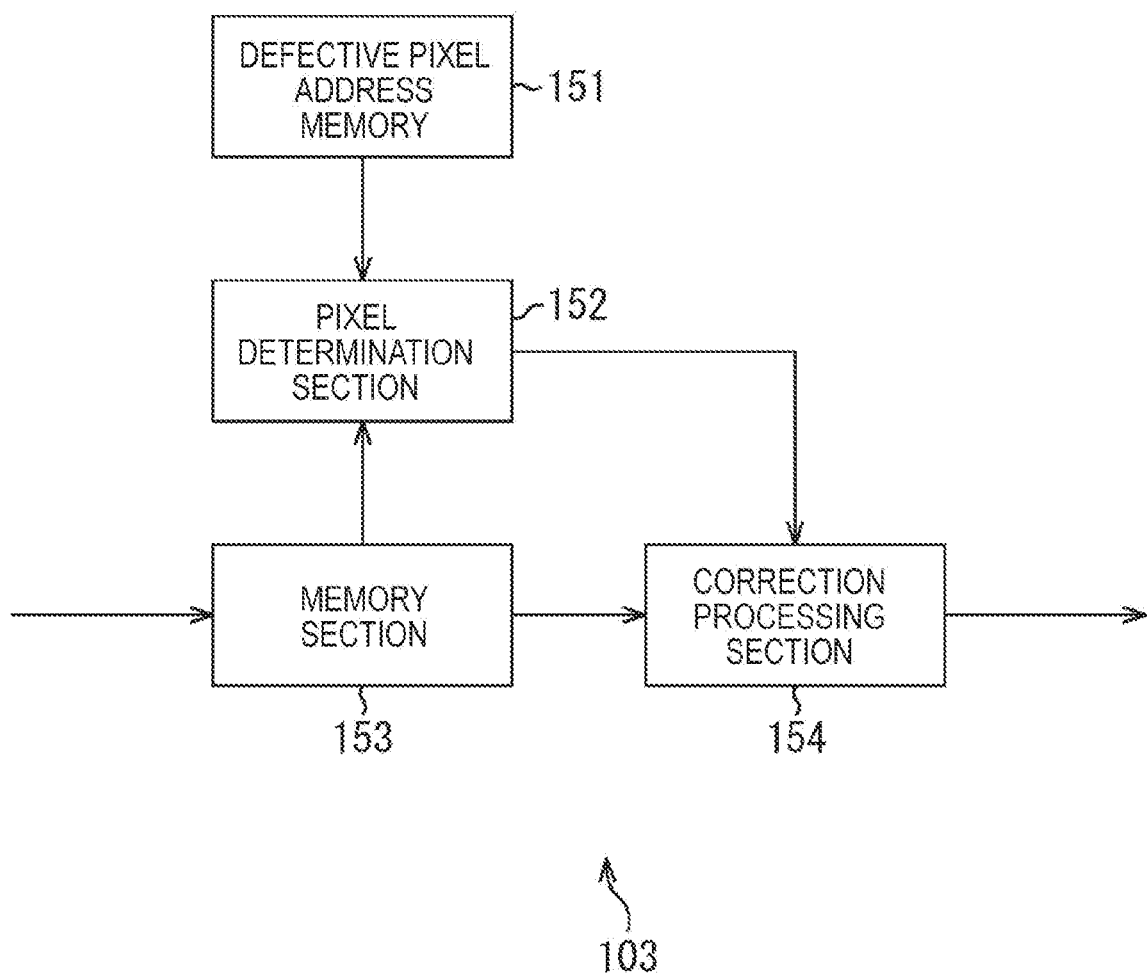
FIG. 8 is a diagram showing an example of the configuration of a DSP circuit.

FIG. 8 is a block diagram showing a first example of the configuration of a DSP circuit that performs pixel correction when a white point is generated.

In the example shown in FIG. 8, the DSP circuit 103 is configured to include a defective pixel address memory 151, a pixel determination section 152, a memory section 153, and a correction processing section 154.

The defective pixel address memory 151 stores the address of a defective pixel determined as a defective pixel in the factory. Determination of a defective pixel is performed as follows. For example, for a white point, a pixel having an output equal to or higher than an output that is a dark state of the OPB reference in the factory is determined as a white point. On the other hand, in the case of HL point defects, in the factory, a pixel in which the ratio of the output of the same color to a certain amount of input light is equal to or higher than a certain ratio (color filter (CF) is missing) or is equal to or less than a certain ratio (dirt) is determined as a defective pixel. The address of the defective pixel determined as described above is written in the defective pixel address memory 151.

The pixel determination section 152 determines whether or not a defective pixel is included in a unit of four adjacent pixels of the same color (coding unit of the CF) in an image stored in the memory section 153 with reference to the defective pixel address stored in the defective pixel address memory 151. The pixel determination section 152 controls the correction process of the correction processing section 154 according to the determination result (that is, the number (percentage) of defective pixels in a four-adjacent-pixels unit of the same color).

The memory section 153 is a frame memory, for example.

The memory section 153 temporarily stores a signal (image) output from the output circuit 7 of the solid state imaging device 1.

The correction processing section 154 reads pixel data from the memory section 153 every four adjacent pixels of the same color, performs correction processing on the pixel data according to the control from the pixel determination section 152, and outputs the result.

<Example of Signal Processing>

Next, an example of signal processing by the DSP circuit 103 shown in FIG. 8 will be described with reference to the flowchart shown in FIG. 9. This signal processing is performed every four adjacent pixels of the same color that are the coding unit of the CF. For example, the signal processing is a process of outputting the pixel data of the four-adjacent-pixels unit of the same color as added data. In addition, a 2×2 pixel sharing unit will be described as an example with reference to FIG. 6 appropriately.

The signal (image) output from the output circuit 7 of the solid state imaging device 1 is stored in the memory section 153. The correction processing section 154 reads four adjacent pixels of the same color to be processed (coding unit of the CF) from the memory section 153.

In step S11, the pixel determination section 152 acquires a defective pixel address of an image from the defective pixel address memory 151. In addition, the defective pixel address can also be acquired every four adjacent pixels of the same color to be processed.

In step S12, the pixel determination section 152 determines whether or not there is no defective pixel in the four adjacent pixels of the same color to be processed with reference to the defective pixel address acquired in step S11. When it is determined that there is no defective pixel in step S12, the process proceeds to step S13.

In step S13, the correction processing section 154 outputs four-pixel data of the four adjacent pixels of the same color read from the memory section 153, as output data, for example, to the frame memory 104 without correction under the control of the pixel determination section 152.

When it is determined that there is a defective pixel in step S12, the process proceeds to step S14. In step S14, the pixel determination section 152 determines whether or not one of the four adjacent pixels of the same color is a defective pixel with reference to the defective pixel address acquired in step S11.

When it is determined that one of the four adjacent pixels of the same color is a defective pixel in step S14, the process proceeds to step S15. In step S15, the correction processing section 154 outputs a result obtained by multiplying three-pixel data other than the defective pixel of the four adjacent pixels of the same color by 4/3, as output data, to the frame memory 104 under the control of the pixel determination section 152. For example, when the green pixel indicated by the circle in FIG. 6 is a defective pixel, data of green pixels indicated by the triangle, rhombus, and inverted triangle of the coding unit of the same green color filter is used. Specifically, a sum of the data of the green pixels indicated by the triangle, the rhombus, and the inverted triangle is multiplied by 4/3, and the result is output as output data of the four adjacent pixels of the same color.

When it is determined that one of the four adjacent pixels of the same color is not a defective pixel in step S14, the process proceeds to step S16. In step S16, the pixel determination section 152 determines whether or not two of the four adjacent pixels of the same color are defective pixels with reference to the defective pixel address acquired in step S11.

When it is determined that two of the four adjacent pixels of the same color are defective pixels in step S16, the process proceeds to step S17. In step S17, the correction processing section 154 outputs a result obtained by multiplying two-pixel data other than the defective pixels of the four adjacent pixels of the same color by 2, as output data, to the frame memory 104 under the control of the pixel determination section 152.

For example, when the green pixels indicated by the circle and the triangle in FIG. 6 are defective pixels, data of green pixels indicated by the rhombus and the inverted triangle of the coding unit of the same green color filter is used. Specifically, a sum of the data of the green pixels indicated by the rhombus and the inverted triangle is multiplied by 2, and the result is output as output data of the four adjacent pixels of the same color.

When it is determined that two of the four adjacent pixels of the same color are not defective pixels in step S16, that is, when three of the four adjacent pixels of the same color are defective pixels in step S16, the process proceeds to step S18. In step S18, the correction processing section 154 outputs a result obtained by multiplying one-pixel data other than the defective pixels of the four adjacent pixels of the same color by 4, as output data, to the frame memory 104 under the control of the pixel determination section 152. In connection with this example, a case where all of four adjacent pixels of the same color are defective pixels is very rare. In such a case, sorting is performed before shipping the CMOS image sensor, so that the CMOS image sensor is not shipped.

For example, when the green pixels indicated by the circle, the triangle, and the rhombus in FIG. 6 are defective pixels, data of a green pixel indicated by the inverted triangle of the coding unit of the same green color filter is used. Specifically, the data of the green pixel indicated by the inverted triangle is multiplied by 4, and the result is output as output data of the four adjacent pixels of the same color.

In step S19, the pixel determination section 152 determines whether or not all processes of the four-adjacent-pixels unit of the same color in the image have ended. When it is determined that the processing on the four-adjacent-pixels unit of the same color has not yet ended in step S19, the process returns to step S12 to repeat the processing for a four-adjacent-pixels unit of the same color to be processed next. When it is determined that the processing on the four-adjacent-pixels unit of the same color has ended in step S19, this signal processing ends.

As described above, when a defective pixel is present in four adjacent pixels of the same color, pixel data of the coding unit of the same color filter as the defective pixel is used for the correction of the defective pixel data.

Depending on an apparatus, the capacity of the defective pixel address memory 151 shown in FIG. 8 may not be sufficient. An example of the process corresponding to such an apparatus will be described below.

<Example of the Configuration of a DSP Circuit>

Figure 10:
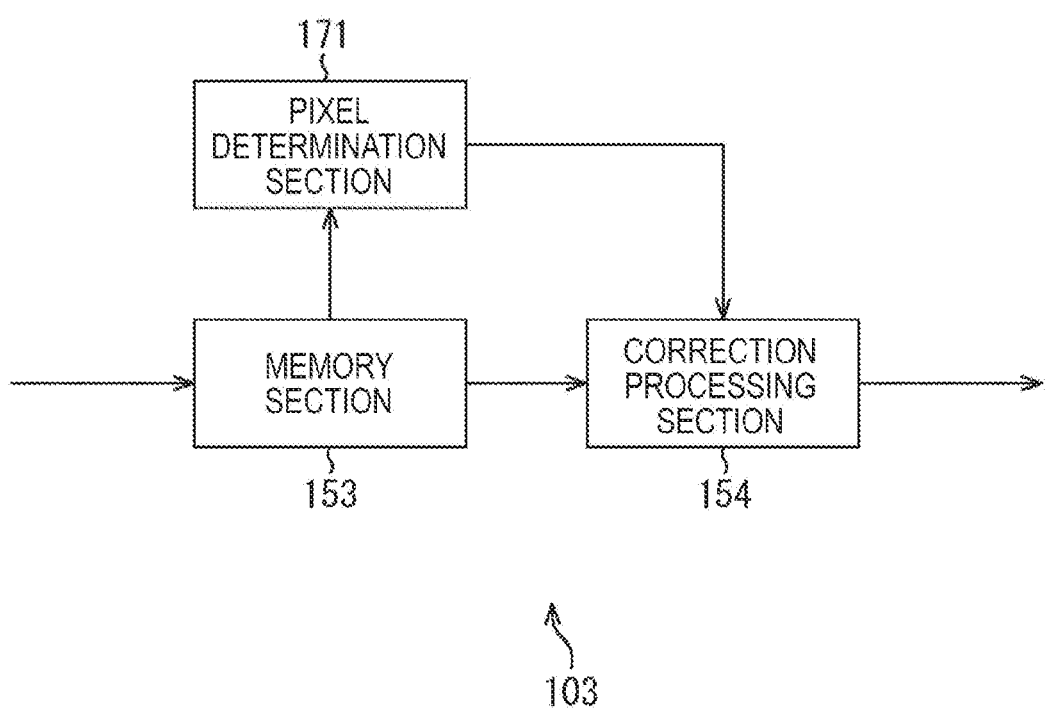
FIG. 10 is a diagram showing an example of the configuration of a DSP circuit.

FIG. 10 is a block diagram showing a second example of the configuration of the DSP circuit that performs pixel correction when a white point is generated.

The DSP circuit 103 shown in FIG. 10 is different from the DSP circuit 103 shown in FIG. 8 in that the defective pixel address memory 151 has been removed and the pixel determination section 152 has been replaced with a pixel determination section 171. The DSP circuit 103 shown in FIG. 10 is the same as the DSP circuit 103 shown in FIG. 8 in that the memory section 153 and the correction processing section 154 are provided.

That is, the pixel determination section 171 makes the correction processing section 154 perform median processing for all of four adjacent pixels of the same color so that point defects can be dynamically corrected.

In addition, in the case of an added output, it is preferable to perform median processing for all pixels and output the result as output data after multiplication of the number of all pixels.

<Example of Signal Processing>

Figure 11:
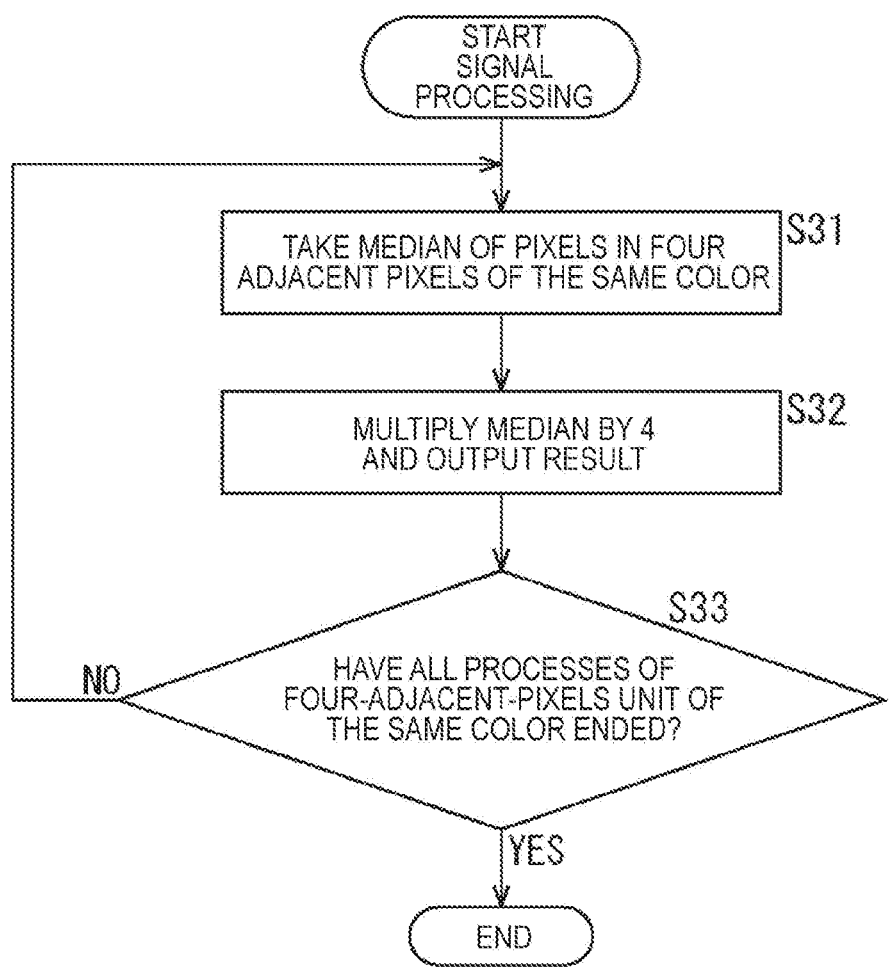
FIG. 11 is a flowchart for explaining an example of signal processing of the DSP circuit shown in FIG. 10.

Next, an example of signal processing by the DSP circuit 103 shown in FIG. 10 will be described with reference to the flowchart shown in FIG. 11. This signal processing is performed in a four-adjacent-pixels unit of the same color. For example, this signal processing is a process of outputting the pixel data of four adjacent pixels of the same color, as added data, to the subsequent stage.

In addition, a 2×2 pixel sharing unit will be described as an example with reference to FIG. 6 appropriately.

The signal (image) output from the output circuit 7 of the solid state imaging device 1 is stored in the memory section 153. The correction processing section 154 reads four adjacent pixels of the same color to be processed from the memory section 153.

In step S31, the correction processing section 154 takes the median of the pixels in the four adjacent pixels of the same color read from the memory section 153 under the control of the pixel determination section 171. In step S32, the correction processing section 154 multiplies the median by 4 and outputs the result as output data under the control of the pixel determination section 171. In addition, in the case of processing in which there is no output as added data, the processing of step S32 is omitted, and the median is output to the subsequent stage.

In step S33, the pixel determination section 171 determines whether or not all processes of the four-adjacent-pixels unit of the same color in the image have ended. When it is determined that the processing on the four-adjacent-pixels unit of the same color has not yet ended in step S33, the process returns to step S31 to repeat the processing for a four-adjacent-pixels unit of the same color to be processed next. When it is determined that the processing on the four-adjacent-pixels unit of the same color has ended in step S33, this signal processing ends.

As described above, a white point can be easily corrected by performing median processing in four adjacent pixels of the same color that are the coding unit of the CF. In addition, HL point defects can also be corrected.

Accordingly, even in an apparatus in which it is difficult to secure the capacity of the defective pixel address memory 151 sufficiently, it is possible to suppress resolution degradation in white point correction. Next, in order to secure a high dynamic range, an example when changing the storage time to perform image processing will be described.

<Example of the Configuration of a DSP Circuit>

Figure 12:
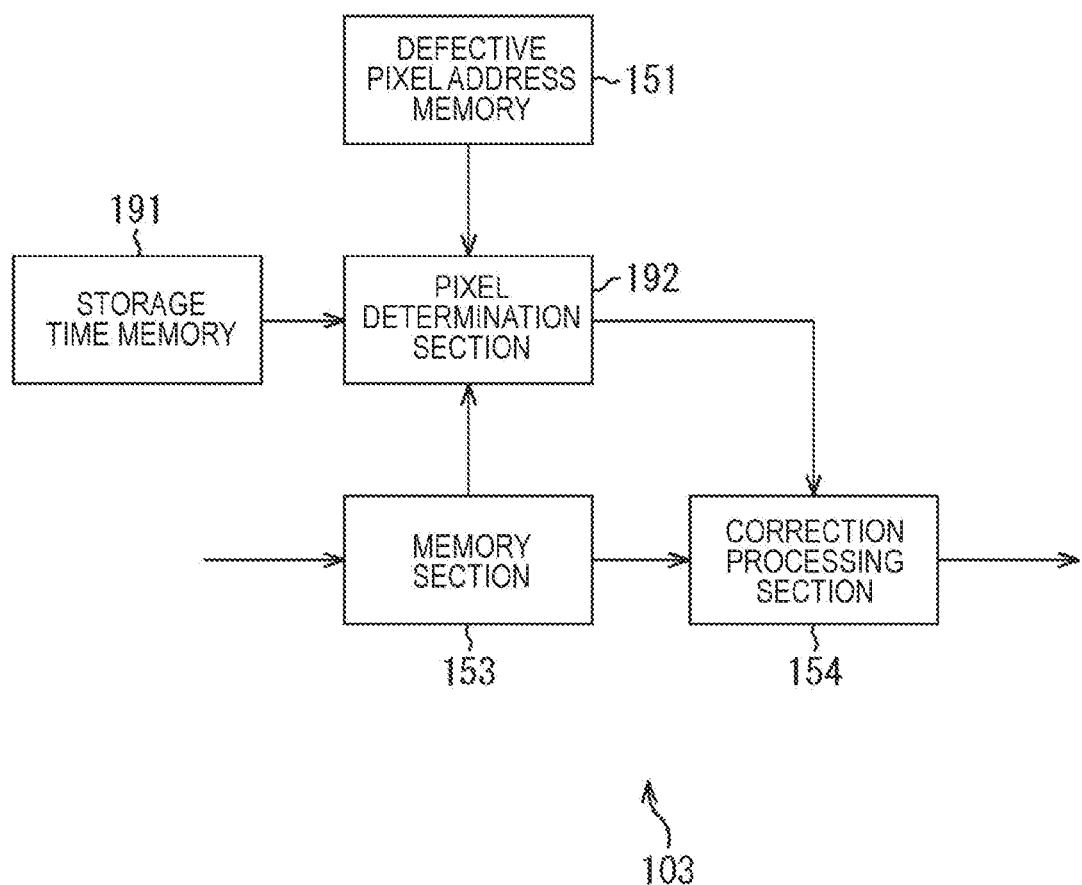
FIG. 12 is a diagram showing an example of the configuration of a DSP circuit.

FIG. 12 is a block diagram showing a third example of the configuration of the DSP circuit that performs pixel correction when a white point is generated.

The DSP circuit 103 shown in FIG. 12 is different from the DSP circuit 103 shown in FIG. 8 in that a storage time memory 191 has been added and the pixel determination section 152 has been replaced with a pixel determination section 192. The DSP circuit 103 shown in FIG. 12 is the same as the DSP circuit 103 shown in FIG. 8 in that the defective pixel address memory 151, the memory section 153, and the correction processing section 154 are provided.

In the solid state imaging device 1, it is possible to obtain a high dynamic range by changing the storage time of light (electric charges) for each pixel. For example, in the example shown in FIG. 12, two types of storage time A and B are set, and the storage time memory 191 stores the storage time (A or B) of each pixel. In addition, the storage time memory 191 may be built into the pixel determination section 192.

The pixel determination section 192 determines whether or not a defective pixel is included in four adjacent pixels of the same color in an image stored in the memory section 153 with reference to the defective pixel address stored in the defective pixel address memory 151. When a defective pixel is included, the pixel determination section 192 determines the defective pixel and a pixel within the same storage time in the four adjacent pixels of the same color with reference to the storage time memory 191, and controls correction processing of the correction processing section 154 according to the determination result (storage time).

<Example of Signal Processing>

Next, an example of signal processing by the DSP circuit 103 shown in FIG. 12 will be described with reference to the flowchart shown in FIG. 13. This signal processing is performed in a four-adjacent-pixels unit of the same color. For example, this signal processing is a process of outputting the pixel data of four adjacent pixels of the same color to the subsequent stage. In addition, a 2×2 pixel sharing unit will be described as an example with reference to FIG. 6 appropriately.

The signal (image) output from the output circuit 7 of the solid state imaging device 1 is stored in the memory section 153. The correction processing section 154 reads a four-adjacent-pixels unit of the same color to be processed from the memory section 153.

In step S51, the pixel determination section 192 acquires a defective pixel address of an image from the defective pixel address memory 151. In addition, the defective pixel address can also be acquired every four adjacent pixels of the same color to be processed.

In step S52, the pixel determination section 192 determines whether or not there is a defective pixel in the four adjacent pixels of the same color to be processed with reference to the defective pixel address acquired in step S51. When it is determined that there is a defective pixel in step S52, the process proceeds to step S53.

In step S53, the correction processing section 154 performs processing on the defective pixel by replacing the data of the defective pixel with data of a pixel of the same storage time under the control of the pixel determination section 192.

That is, the pixel determination section 192 determines a defective pixel and a pixel within the same storage time in four adjacent pixels of the same color, and performs processing on the defective pixel by replacing the data of the defective pixel with data of an image of the same storage time.

In the example shown in FIG. 6, assuming that the green pixels indicated by the circle and the inverted triangle are set to the storage time A and the green pixels indicated by the triangle and the rhombus are set to the storage time B, when the green pixel indicated by the circle is a defective pixel, processing for the green pixel indicated by the circle is performed by replacing the data of the defective pixel with data of the pixel indicated by the inverted triangle. For example, in the example shown in FIG. 6, assuming that the green pixels indicated by the circle and the rhombus are set to the storage time A and the green pixels indicated by the triangle and the inverted triangle are set to the storage time B by exchanging the storage times, when the green pixel indicated by the circle is a defective pixel, processing for the green pixel indicated by the circle is performed by replacing the data of the defective pixel with data of the pixel indicated by the rhombus.

In addition, as an example of the processing performed in step S53, replaced data is output as output data in the case of one-pixel output, for example. In the case of added data output, replaced data is used, and output data is added and output.

As described above, even when securing a high dynamic range, it is possible to suppress resolution degradation in white point correction.

<Explanation of the Effects>

Figure 14:
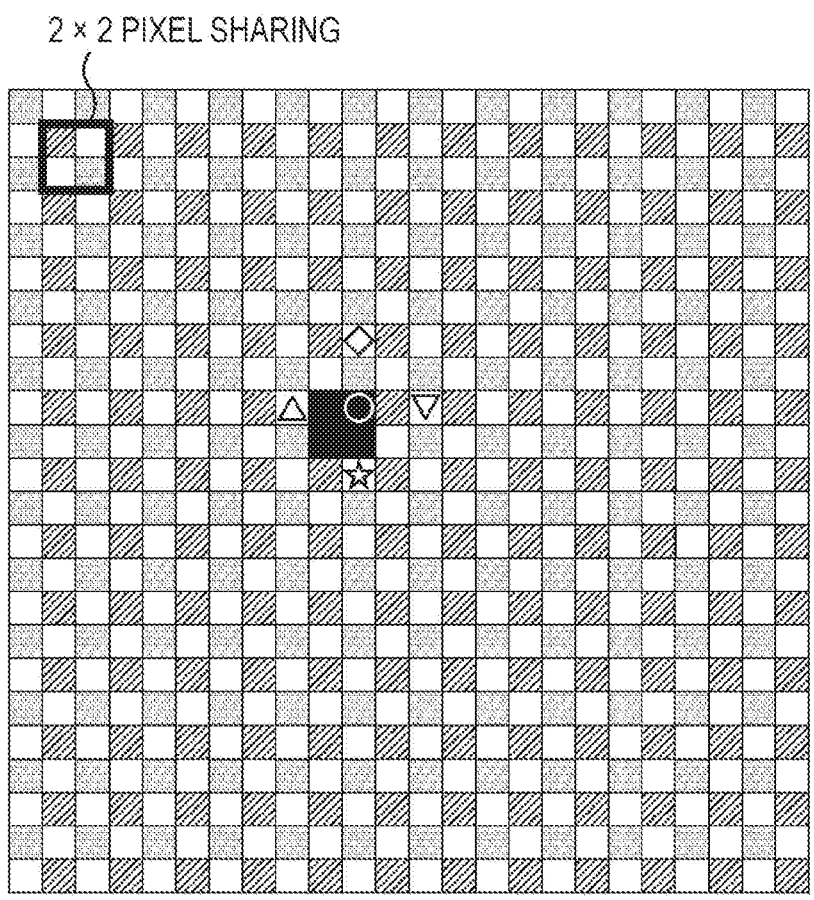
FIG. 14 is a diagram showing an example of the checker RGB Bayer array of each pixel.

In the example shown in FIG. 6, the color filter arrangement of only 2×2 pixels in the 2×2 pixel sharing unit is the same as the normal checker RGB Bayer array (that is, checker RGB Bayer array of each pixel) shown in the example of FIG. 14. When only the 2×2 pixel sharing unit is viewed, these pixels are separately read from the memory.

However, in the Bayer array shown in FIG. 14, when there is a defect in a sharing unit in which a green pixel indicated by a circle is included, data of the green pixel indicated by the circle is replaced with data, which is separately read, of neighboring green pixels that are separated by one pixel from the green pixel indicated by the circle and are indicated by a triangle, a rhombus, an inverted triangle, and a star.

Alternatively, it is necessary to perform defect correction using the average value of the data of the neighboring green pixels that are separated by one pixel from the green pixel indicated by the circle and are indicated by the triangle, the rhombus, the inverted triangle, and the star.

In contrast, in the example shown in FIG. 6, since the data of the four-adjacent-pixels unit of the same color (coding unit of the CF) is read from the memory, correction in the four-adjacent-pixels unit of the same color can be performed immediately. As described above, the signal processing in the example shown in FIG. 14 is different from that in the example shown in FIG. 6.

As described above, even if a white point is generated due to leakage of the floating diffusion portion in the pixel sharing unit or the like, white correction can be performed with pixels of the same color of a different pixel sharing unit. Since the pixels are spatially close to the defective pixel, it is possible to suppress image degradation more than in a case where pixels are spatially far from the defective pixel.

In addition, although the case where the pixel sharing unit is 2×2 pixels has been described above, the pixel sharing unit is not limited to 2×2 pixels, and pixel sharing units other than 2×2 pixels may also be used. Hereinafter, other pixel sharing units will be described.

2. Second Embodiment (Example of 2×4 Pixel Sharing)

<Example of the Configuration of a Pixel Sharing Unit>

Figure 15:
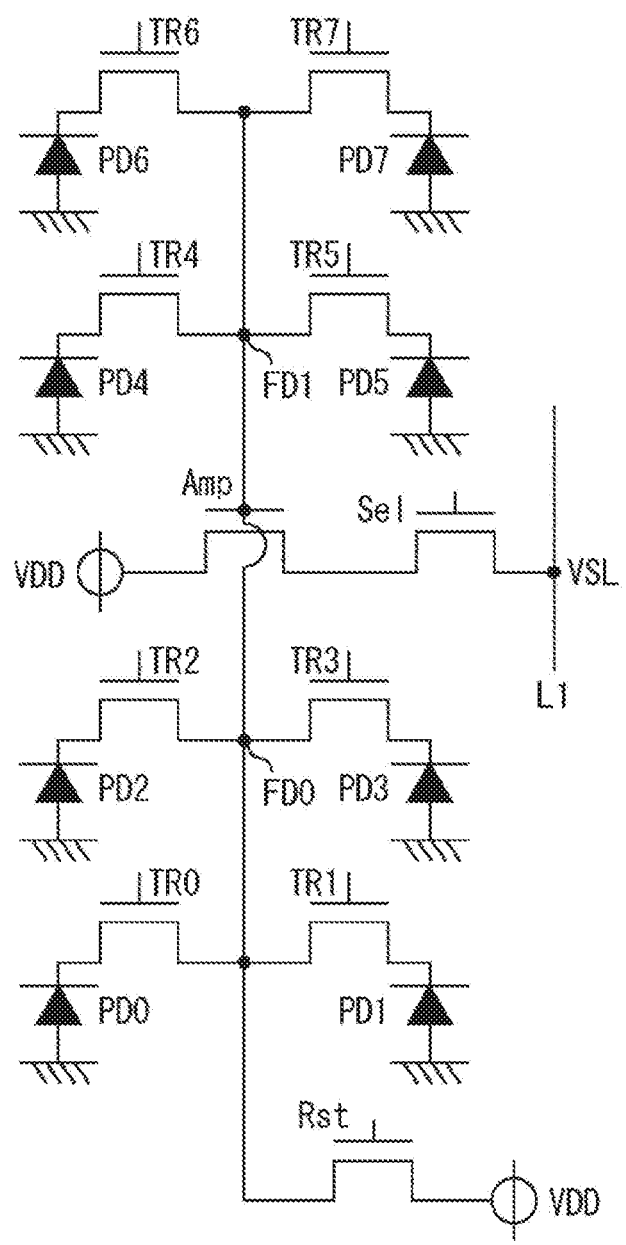
FIG. 15 is a circuit diagram showing an example of the circuit configuration of a 2×4 pixel sharing unit.
Figure 16:
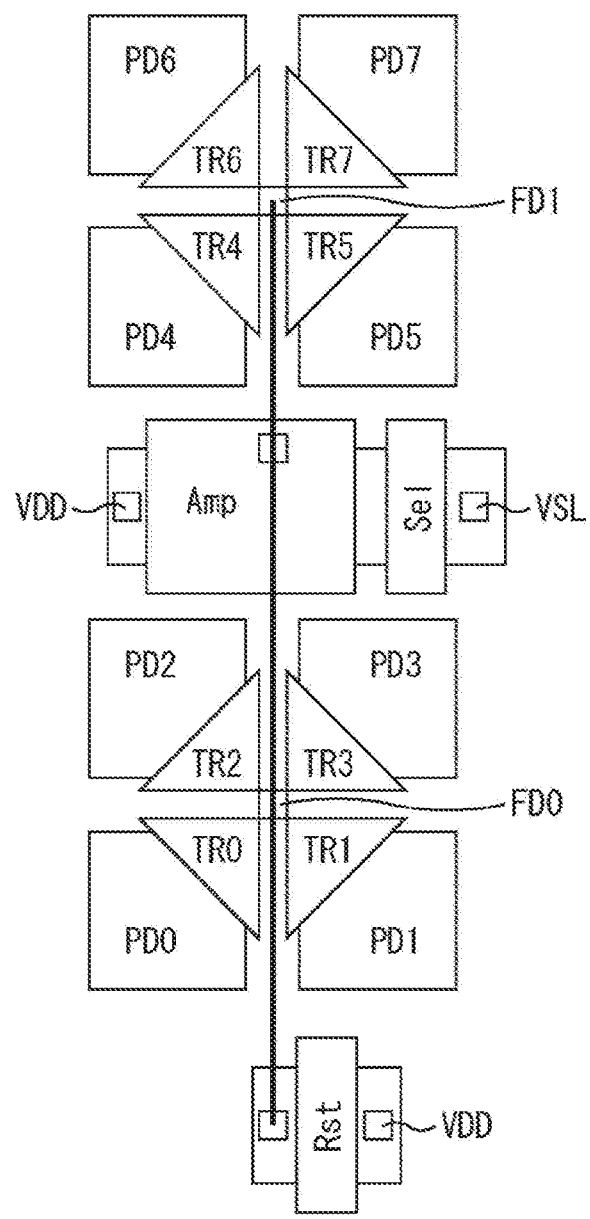
FIG. 16 is a plan view showing an example of the circuit configuration of the 2×4 pixel sharing unit.

First, an example of the circuit configuration of a 2×4 pixel sharing unit will be described with reference to FIGS. 15 and 16. FIG. 15 is a circuit diagram showing an example of the circuit configuration of the 2×4 pixel sharing unit. FIG. 16 is a plan view showing an example of the circuit configuration of the 2×4 pixel sharing unit. In addition, the 2×4 pixel sharing unit described with reference to FIGS. 15 and 16 is different from the 2×2 pixel sharing unit described with reference to FIGS. 3 and 4 only in the number of pixels, and the basic functions of transistors and the like are the same.

As shown in FIGS. 15 and 16, the 2×4 pixel sharing unit is configured to include eight photoelectric conversion elements, for example, photodiodes PD0 to PD7, eight transfer transistors TR0 to TR7 corresponding to the photodiodes PD0 to PD7, and three transistors of a reset transistor Rst, an amplifier transistor Amp, and a selection transistor Sel.

The photodiodes PD0 to PD7 have anode electrodes connected to the negative power supply (for example, ground), and performs photoelectric conversion of received light into optical charges (here, photoelectrons) of the amount of electric charges corresponding to the amount of received light. Cathode electrodes of the photodiodes PD0 to PD7 are electrically connected to a gate electrode of the amplifier transistor Amp through the corresponding transfer transistors TR0 to TR7. A node at which the gate electrode of the amplifier transistor Amp is electrically connected to the four transfer transistors TR0 to TR3 is referred to as a floating diffusion FD0. A node at which the gate electrode of the amplifier transistor Amp is electrically connected to the four transfer transistors TR4 to TR7 is referred to as a floating diffusion FD1.

The transfer transistors TR0 to TR3 are connected between the cathode electrodes of the corresponding photodiodes PD0 to PD3 and the floating diffusion FD0. In addition, the transfer transistors TR4 to TR7 are connected between the cathode electrodes of the corresponding photodiodes PD4 to PD7 and the floating diffusion FD1.

A high-level (for example, a VDD level) active (hereinafter, referred to as "High active") transfer pulse φTRF is applied to gate electrodes of the transfer transistors TR0 to TR7 through a transfer line (not shown). By applying the transfer pulse φTRF, the transfer transistors TR0 to TR3 are turned on, and optical charges generated by photoelectric conversion in the photodiodes PD0 to PD3 are transferred to the floating diffusion FD0. Similarly, by applying the transfer pulse φTRF, the transfer transistors TR4 to TR7 are turned on, and optical charges generated by photoelectric conversion in the photodiodes PD4 to PD7 are transferred to the floating diffusion FD1.

The reset transistor Rst has a drain electrode connected to the pixel power supply VDD and a source electrode connected to the floating diffusion FD0. A High active reset pulse φRST is applied to the gate electrode of the reset transistor Rst through a reset line (not shown) before the transfer of signal charges from the photodiodes PD0 to PD3 to the floating diffusion FD0 and from the photodiodes PD4 to PD7 to the floating diffusion FD1. The reset transistor Rst is turned on by applying the reset pulse φRST, and the floating diffusions FD0 and FD1 are reset by discarding the electric charges of the floating diffusions FD0 and FD1 to the pixel power supply VDD.

The amplifier transistor Amp has a gate electrode connected to the floating diffusions FD0 and FD1 and a drain electrode connected to the pixel power supply VDD. In addition, the amplifier transistor Amp outputs the electric potentials of the floating diffusions FD0 and FD1 after the reset by the reset transistor Rst as a reset signal (reset level) Vreset. In addition, the amplifier transistor Amp outputs, as a light accumulation signal (signal level) Vsig, the electric potential of the floating diffusion FD0 after transferring signal charges by the transfer transistors TR0 to TR3 and the electric potential of the floating diffusion FD1 after transferring signal charges by the transfer transistors TR4 to TR7.

The selection transistor Sel has a drain electrode connected to the source electrode of the amplifier transistor Amp and a source electrode connected to the vertical signal line L1, for example. A High active selection pulse φSEL is applied to a gate electrode of the selection transistor Sel through a selection line (not shown). By applying the selection pulse φSEL, the selection transistor Sel is turned on to select a unit pixel, and a signal output from the amplifier transistor Amp is relayed to the vertical signal line L1.

In addition, the selection transistor Sel may also be connected between the pixel power supply VDD and the drain of the amplifier transistor Amp.

<Relationship Between a Pixel Sharing Unit and a CF Coding Unit>

Figure 17:
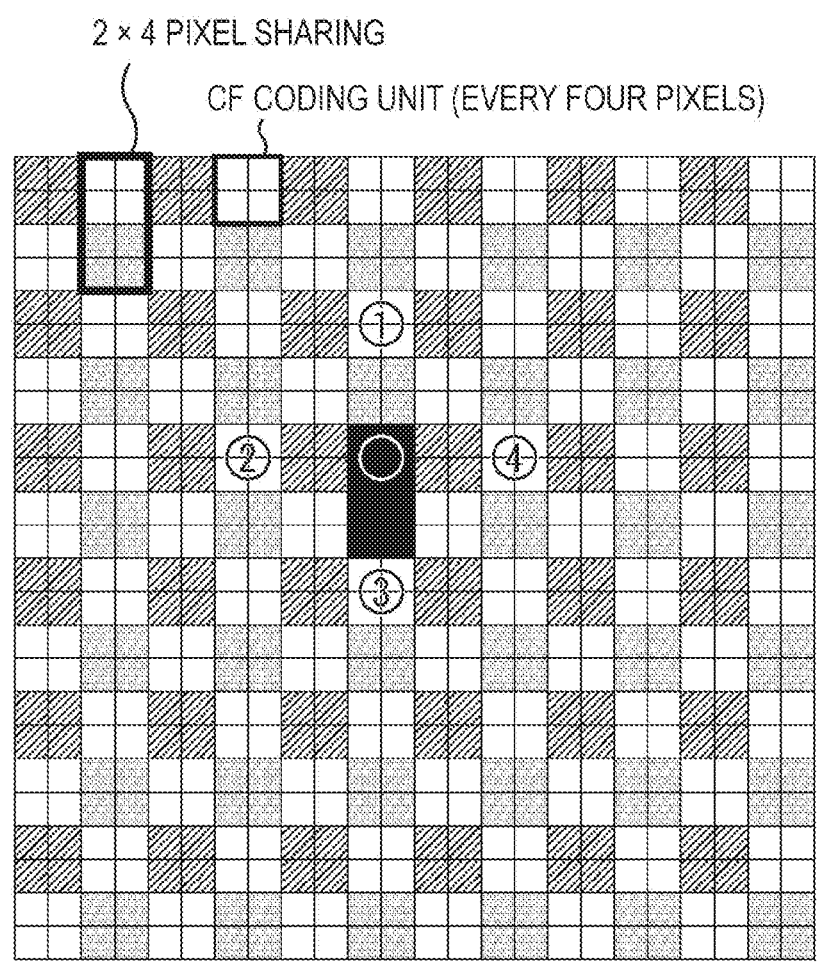
FIG. 17 is a diagram showing an example of the relationship between a 2×4 pixel sharing unit and a coding unit of a color filter.

FIG. 17 is a diagram showing the relationship between a 2×4 pixel sharing unit and a coding unit of a color filter (CF). In the example shown in FIG. 17, an example of 2×4 pixel sharing is shown by the heavy line, and an example in which RGB checker coding (Bayer array) of the same color filter has been performed every four pixels is shown by the solid line.

That is, in the example shown in FIG. 17, four pixels in the upper half and four pixels in the lower half of 2×4 pixels of the pixel sharing unit are coded with the same color filter.

Therefore, when a white point is generated in a black 2×4 pixel portion at the center due to leakage of the floating diffusion or the like, it can be considered to correct a green pixel with a circle using green pixels disposed at the most peripheral positions shown by the numbers of 1 to 4 in the figure. That is, in the example shown in FIG. 17, the green pixel with a circle is corrected using data that is spatially separated by two pixels in the unit pixel.

<Relationship Between a CF Coding Unit and a Pixel Sharing Unit of the Present Technology>

Figure 18:
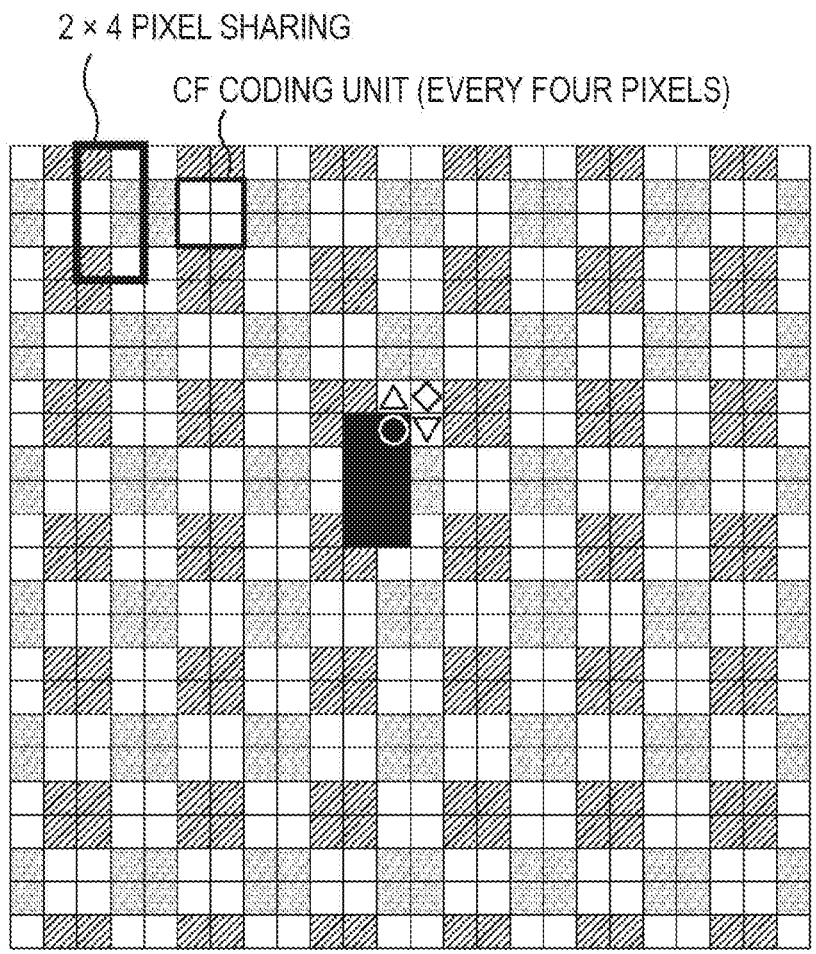
FIG. 18 is a diagram showing the relationship between a coding unit of a color filter and a 2×4 pixel sharing unit according to an embodiment of the present technology.

FIG. 18 is a diagram showing the relationship between a coding unit of a color filter (CF) and a pixel sharing unit to which the present technology is applied. In the example shown in FIG. 18, an example of 2×4 pixel sharing is shown by the heavy line, and an example in which RGB checker coding (Bayer array) of the same color filter has been performed every four pixels is shown by the solid line.

In the example shown in FIG. 18, two upper pixels and two lower pixels of 2×4 pixels of the pixel sharing unit are coded with different color filters, as shown by the heavy line in FIG. 18. Four pixels at the center of the 2×4 pixels of the pixel sharing unit are coded with the same color filter by two pixels, as shown by the heavy line in FIG. 18. In other words, four pixels of the coding unit of the same color filter are configured to include pixels with no pixel sharing between each other. That is, four pixels of the coding unit of the same color filter are configured such that at least a half of the configuration is pixels of different pixel sharing units. In addition, the color filter 35 shown in FIG. 18 is formed by moving the color filter shown in FIG. 17 by one pixel upward and by one pixel rightward, for example.

Thus, when a white point is generated in a black pixel portion at the center due to leakage of the floating diffusion or the like, the correction of a green pixel indicated by a circle in the black pixel portion is performed using at least one of green pixels, which are indicated by a triangle, a rhombus, and an inverted triangle, of the coding unit of the same green color filter.

That is, in the example shown in FIG. 18, pixels used in correction are adjacent pixels. Therefore, since the correction can be performed with spatially close data, it is possible to suppress resolution degradation more than in the example shown in FIG. 17.

In addition, since the configuration of an electronic apparatus that performs pixel correction when a white point is generated is basically the same as the configuration of the electronic apparatus in the example of FIG. 6 described above with reference to FIG. 7, explanation thereof will be omitted. In addition, since the example of signal processing for performing pixel correction when a white point is generated is basically the same as the signal processing described with reference to FIGS. 9, 11, and 13, explanation thereof will be omitted.

Figure 9:
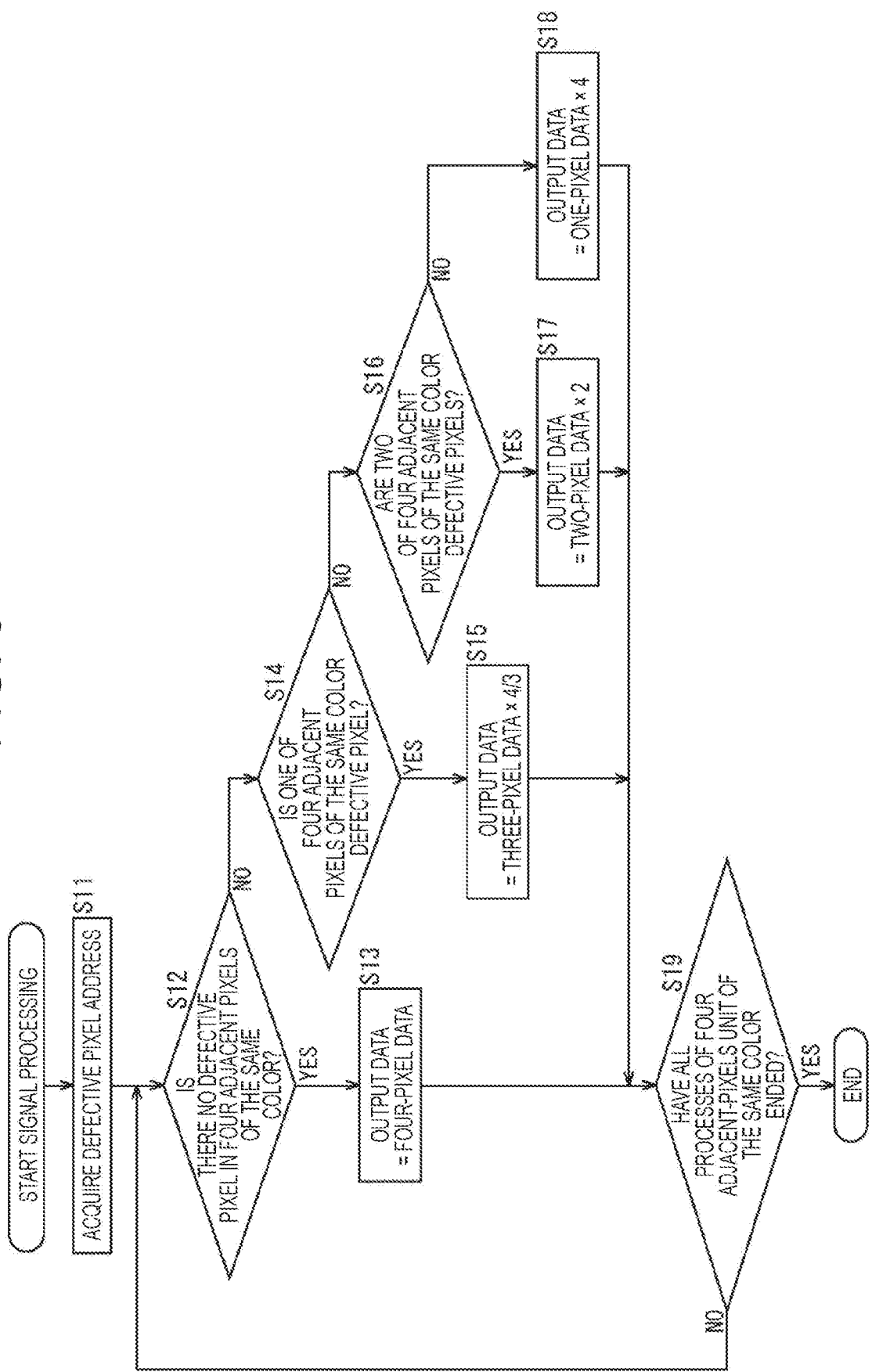
FIG. 9 is a flowchart for explaining an example of signal processing of the DSP circuit shown in FIG. 8.
Figure 13:
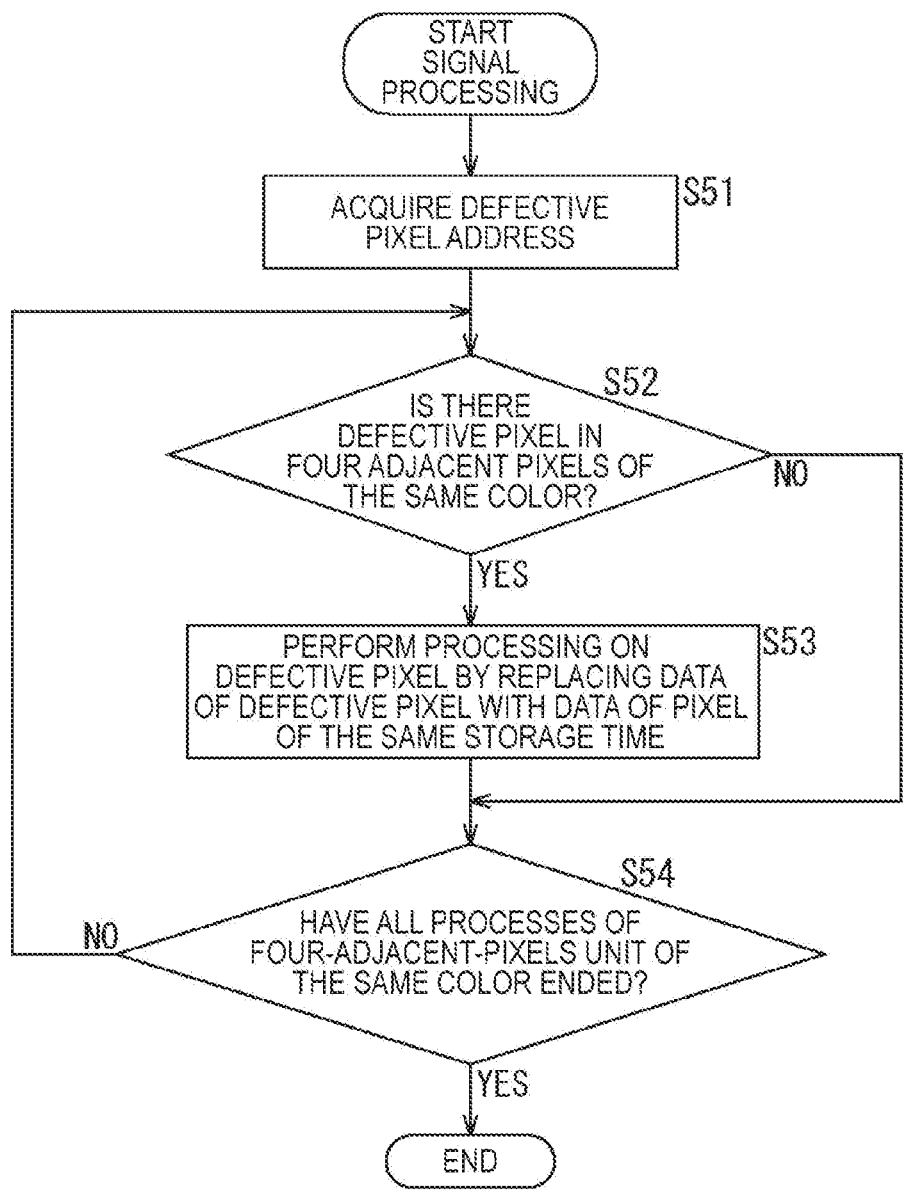
FIG. 13 is a flowchart for explaining an example of signal processing of the DSP circuit shown in FIG. 12.

That is, for two upper pixels and two lower pixels of 2×4 pixels of the pixel sharing unit, the signal processing in the example shown in FIGS. 9 and 13 is performed in basically the same manner as in the example shown in FIG. 6. On the other hand, for four pixels at the center of the 2×4 pixels of the pixel sharing unit, the signal processing in the example shown in FIGS. 9 and 13 is performed in the same manner as in a case shown in FIG. 19, which will be described later, since the respective two pixels are included in the same pixel sharing unit.

In addition, the relationship between the 2×4 pixel sharing unit and the CF coding unit may be as follows.

<Relationship Between a CF Coding Unit and a Pixel Sharing Unit of the Present Technology>

Figure 19:
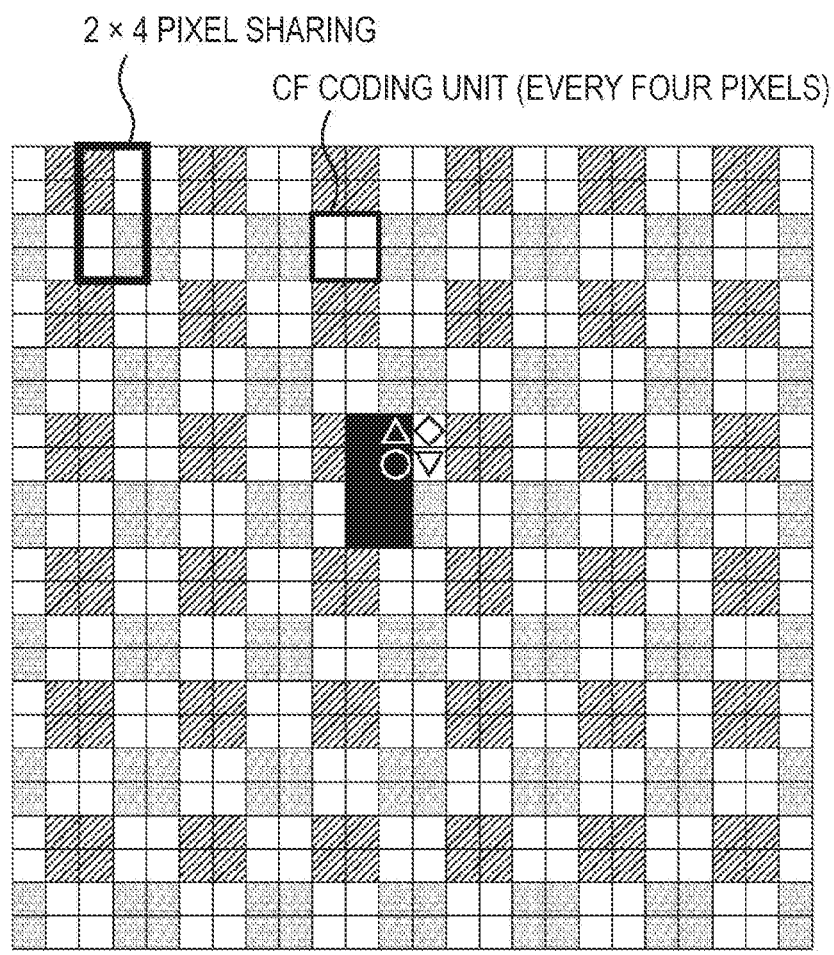
FIG. 19 is a diagram showing the relationship between a coding unit of a color filter and a 2×4 pixel sharing unit according to an embodiment of the present technology.

FIG. 19 is a diagram showing the relationship between a coding unit of a color filter (CF) and a pixel sharing unit to which the present technology is applied. In the example shown in FIG. 19, an example of 2×4 pixel sharing is shown by the heavy line, and an example in which RGB checker coding (Bayer array) of the same color filter has been performed every four pixels is shown by the solid line.

In the example shown in FIG. 19, similar to the case of four pixels at the center of the pixel sharing unit shown in FIG. 18, respective pixels of the 2×4 pixels of the pixel sharing unit are coded with the same color filter by two pixels, as shown by the heavy line in FIG. 19. In other words, four pixels of the coding unit of the same color filter are configured to include pixels with no pixel sharing between each other. That is, four pixels of the coding unit of the same color filter are configured such that at least a half of the configuration is pixels of different pixel sharing units.

In addition, the color filter 35 shown in FIG. 19 is formed by moving the color filter shown in FIG. 17 by one pixel rightward, for example.

Thus, when a white point is generated in a black pixel portion at the center due to leakage of the floating diffusion or the like, the correction of green pixels indicated by a triangle and a circle in the black pixel portion is performed using green pixels, which are indicated by a rhombus and an inverted triangle, of the coding unit of the same green color filter.

That is, in the example shown in FIG. 19, pixels used in correction are adjacent pixels. Therefore, since the correction can be performed with spatially close data, it is possible to suppress resolution degradation more than in the example shown in FIG. 17.

In addition, since the configuration of an electronic apparatus that performs pixel correction when a white point is generated is basically the same as the configuration of the electronic apparatus in the example of FIG. 6 described above with reference to FIG. 7, explanation thereof will be omitted. In addition, since the example of signal processing for performing pixel correction when a white point is generated is basically the same as the signal processing described with reference to FIGS. 9, 11, and 13, explanation thereof will be omitted.

That is, in 2×4 pixels of the pixel sharing unit, the respective two pixels (for example, pixels indicated by the triangle and the circle in FIG. 19) are included in the same pixel sharing unit. Therefore, in particular, in the example shown in FIG. 9, signal processing when two pixels of the pixel sharing unit are defective pixels is performed similar to the processing of step S17.

In addition, in the example shown in FIG. 13, assuming that a pixel indicated by the circle and a pixel indicated by the inverted triangle are set to the storage time A and a pixel indicated by the triangle and a pixel indicated by the rhombus are set to the storage time B (assuming that there are two types of storage time), data of a defective pixel indicated by the circle can be replaced with data of the pixel indicated by the inverted triangle. In addition, data of a defective pixel indicated by the triangle can be replaced with data of the pixel indicated by the rhombus.

As described above, even when a pixel sharing unit is 2×4 pixels, it is possible to suppress resolution degradation in white point correction.

3. Third Embodiment (Example of 1×4 Pixel Sharing)

<Example of the Configuration of a Pixel Sharing Unit>

Figure 20:
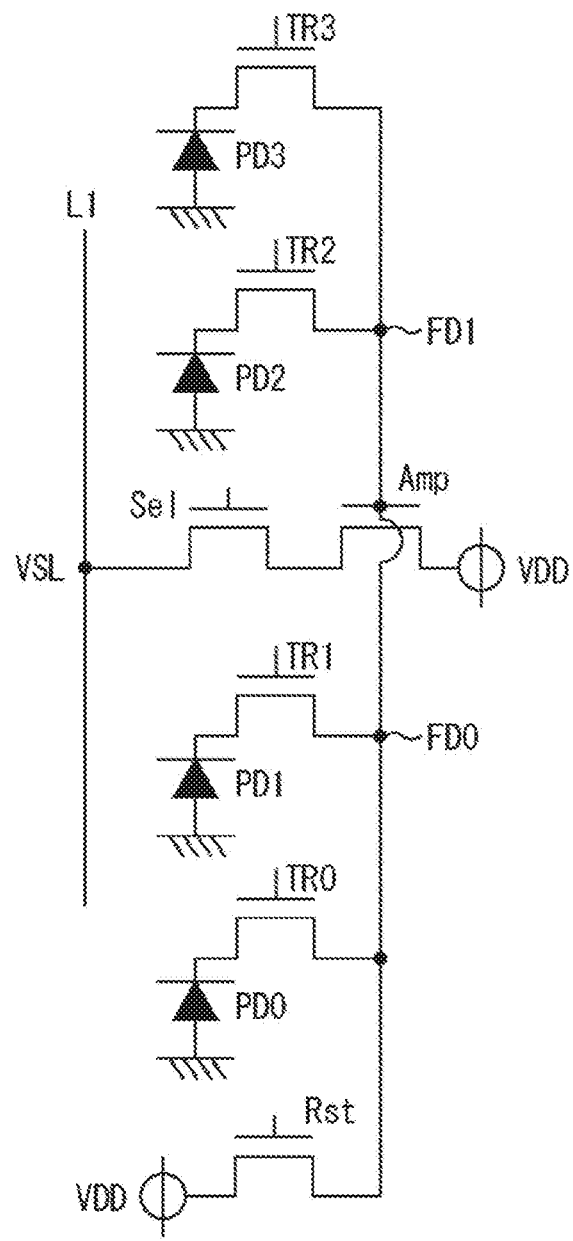
FIG. 20 is a circuit diagram showing an example of the circuit configuration of a 1×4 pixel sharing unit.
Figure 21:
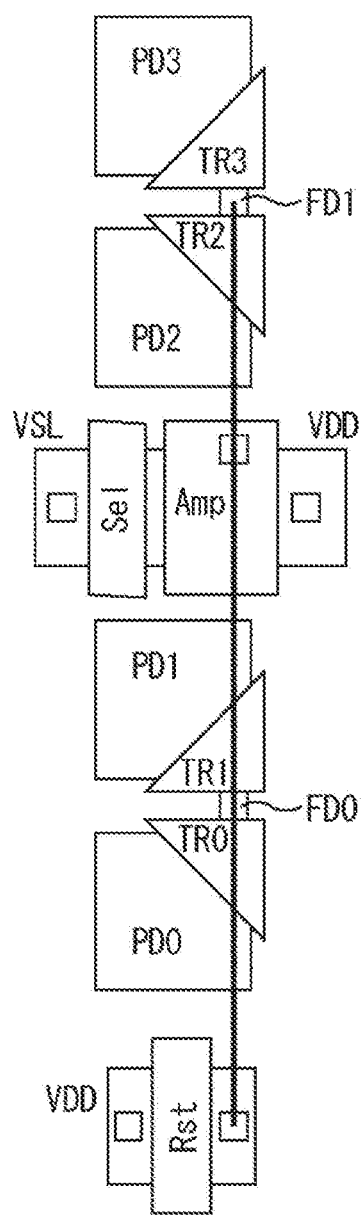
FIG. 21 is a plan view showing an example of the circuit configuration of the 1×4 pixel sharing unit.

First, an example of the circuit configuration of a 1×4 pixel sharing unit will be described with reference to FIGS. 20 and 21. FIG. 20 is a circuit diagram showing an example of the circuit configuration of the 1×4 pixel sharing unit. FIG. 21 is a plan view showing an example of the circuit configuration of the 1×4 pixel sharing unit. In addition, the 2×4 pixel sharing unit described with reference to FIGS. 20 and 21 is different from the 2×2 pixel sharing unit described with reference to FIGS. 3 and 4 only in the number of pixels, and the basic functions of transistors and the like are the same.

As shown in FIGS. 20 and 21, the 1×4 pixel sharing unit is configured to include four photoelectric conversion elements, for example, photodiodes PD0 to PD3, four transfer transistors TR0 to TR3 corresponding to the photodiodes PD0 to PD3, and three transistors of a reset transistor Rst, an amplifier transistor Amp, and a selection transistor Sel.

The photodiodes PD0 to PD3 have anode electrodes connected to the negative power supply (for example, ground), and perform photoelectric conversion of received light into optical charges (here, photoelectrons) of the amount of electric charges corresponding to the amount of received light. Cathode electrodes of the photodiodes PD0 to PD3 are electrically connected to a gate electrode of the amplifier transistor Amp through the corresponding transfer transistors TR0 to TR3. A node at which the gate electrode of the amplifier transistor Amp is electrically connected to the two transfer transistors TR0 and TR1 is referred to as a floating diffusion FD0.

A node at which the gate electrode of the amplifier transistor Amp is electrically connected to the two transfer transistors TR2 and TR3 is referred to as a floating diffusion FD1.

The transfer transistors TR0 to TR3 are connected between the cathode electrodes of the corresponding photodiodes PD0 to PD3 and the floating diffusion FD0 or FD1. A high-level (for example, a VDD level) active (hereinafter, referred to as "High active") transfer pulse φTRF is applied to gate electrodes of the transfer transistors TR0 to TR3 through a transfer line (not shown). By applying the transfer pulse φTRF, the transfer transistors TR0 to TR3 are turned on, and optical charges generated by photoelectric conversion in the photodiodes PD0 to PD3 are transferred to the floating diffusion FD0 or FD1.

The reset transistor Rst has a drain electrode connected to the pixel power supply VDD and a source electrode connected to the floating diffusions FD0 and FD1. A High active reset pulse φRST is applied to the gate electrode of the reset transistor Rst through a reset line (not shown) before the transfer of signal charges from the photodiodes PD0 and PD1 to the floating diffusion FD0 and from the photodiodes PD2 and PD3 to the floating diffusion FD1. The reset transistor Rst is turned on by applying the reset pulse φRST, and the floating diffusions FD0 and FD1 are reset by discarding the electric charges of the floating diffusions FD0 and FD1 to the pixel power supply VDD.

The amplifier transistor Amp has a gate electrode connected to the floating diffusions FD0 and FD1 and a drain electrode connected to the pixel power supply VDD. In addition, the amplifier transistor Amp outputs the electric potentials of the floating diffusions FD0 and FD1 after the reset by the reset transistor Rst as a reset signal (reset level) Vreset. In addition, the amplifier transistor Amp outputs, as a light accumulation signal (signal level) Vsig, the electric potential of the floating diffusion FD0 after transferring signal charges by the transfer transistors TR0 and TR1 and the electric potential of the floating diffusion FD1 after transferring signal charges by the transfer transistors TR2 and TR3.

The selection transistor Sel has a drain electrode connected to the source electrode of the amplifier transistor Amp and a source electrode connected to the vertical signal line L1, for example. A High active selection pulse φSEL is applied to a gate electrode of the selection transistor Sel through a selection line (not shown). By applying the selection pulse φSEL, the selection transistor Sel is turned on to select a unit pixel, and a signal output from the amplifier transistor Amp is relayed to the vertical signal line L1.

In addition, the selection transistor Sel may also be connected between the pixel power supply VDD and the drain of the amplifier transistor Amp.

<Relationship Between a CF Coding Unit and a Pixel Sharing Unit of the Present Technology>

Figure 22:
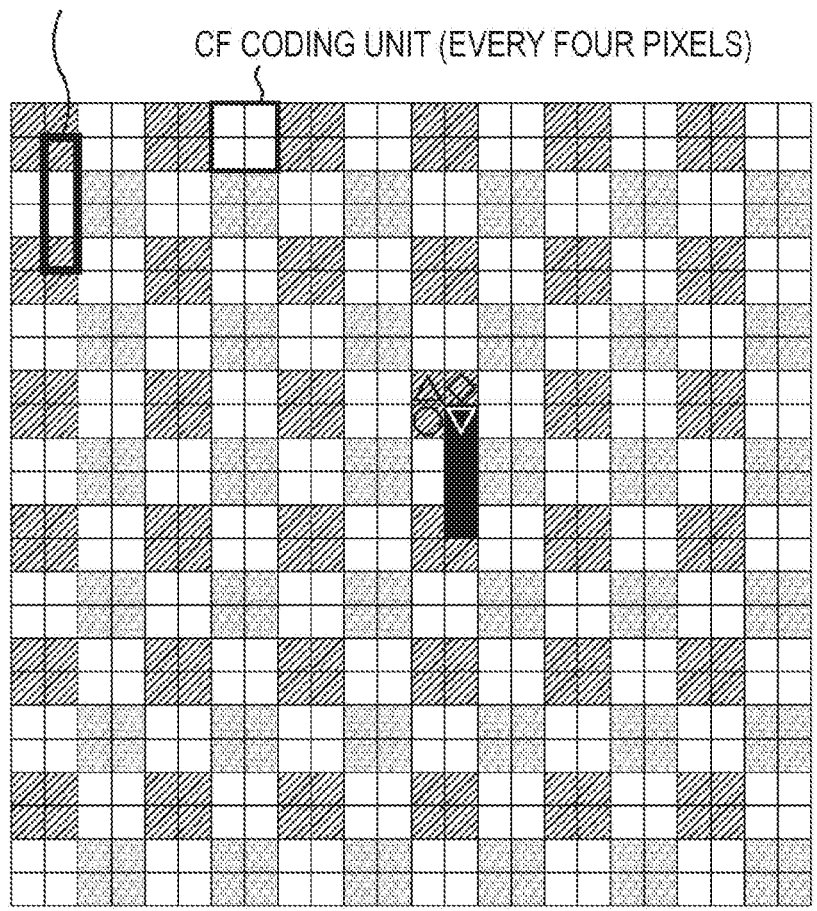
FIG. 22 is a diagram showing the relationship between a coding unit of a color filter and a 1×4 pixel sharing unit according to an embodiment of the present technology.

FIG. 22 is a diagram showing the relationship between a coding unit of a color filter (CF) and a pixel sharing unit to which the present technology is applied. In the example shown in FIG. 22, an example of 1×4 pixel sharing is shown by the heavy line, and an example in which RGB checker coding (Bayer array) of the same color filter has been performed every four pixels is shown by the solid line.

In the example shown in FIG. 22, one upper pixel and one lower pixel of 1×4 pixels of the pixel sharing unit are coded with different color filters, as shown by the heavy line in FIG. 22. Two pixels at the center of the 1×4 pixels of the pixel sharing unit are coded with the same color filter, as shown by the heavy line in FIG. 22. In other words, four pixels of the coding unit of the same color filter are configured to include pixels with no pixel sharing between each other. That is, four pixels of the coding unit of the same color filter are configured such that at least a half of the configuration is pixels of different pixel sharing units.

Thus, when a white point is generated in a black pixel portion at the center due to leakage of the floating diffusion or the like, the correction of a red pixel indicated by an inverted triangle in the black pixel portion is performed using red pixels, which are indicated by a triangle, a rhombus, and a circle, of the coding unit of the same red color filter.

That is, since pixels used in correction are adjacent pixels, the correction can be performed with spatially close data. Therefore, it is possible to suppress resolution degradation.

In addition, the relationship between the 1×4 pixel sharing unit and the CF coding unit may be as follows.

<Relationship Between a CF Coding Unit and a Pixel Sharing Unit of the Present Technology>

Figure 23:
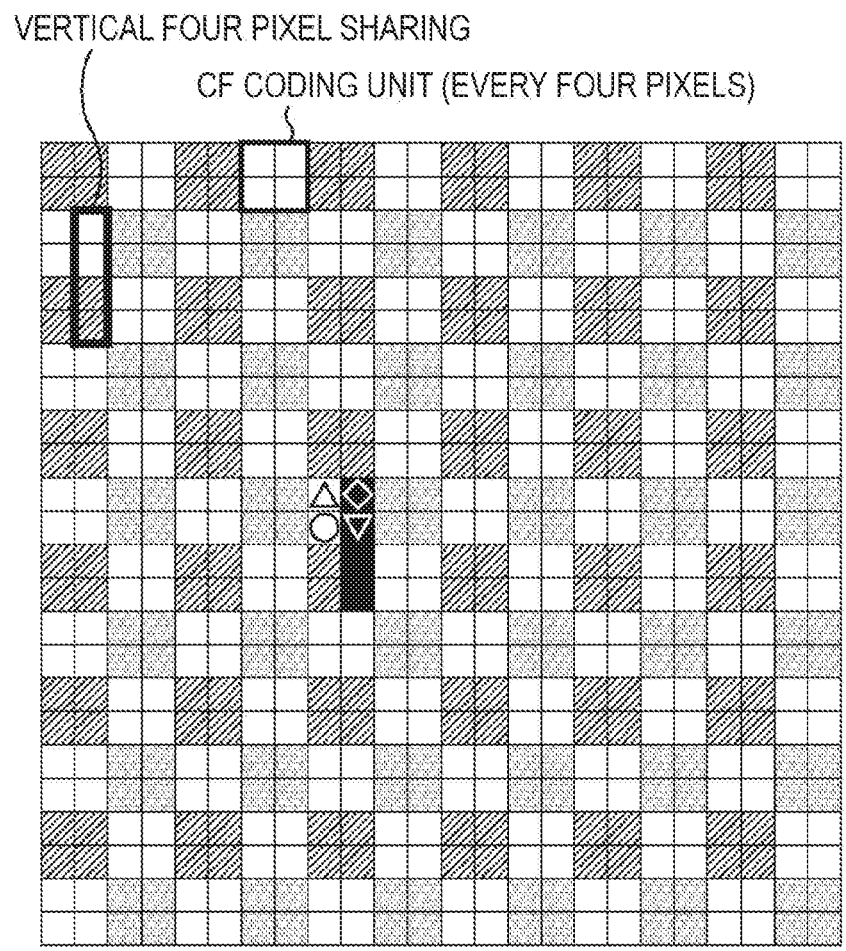
FIG. 23 is a diagram showing the relationship between a coding unit of a color filter and a 1×4 pixel sharing unit according to an embodiment of the present technology.

FIG. 23 is a diagram showing the relationship between a coding unit of a color filter (CF) and a pixel sharing unit to which the present technology is applied. In the example shown in FIG. 23, an example of 1×4 pixel sharing is shown by the heavy line, and an example in which RGB checker coding (Bayer array) of the same color filter has been performed every four pixels is shown by the solid line.

In the example shown in FIG. 23, similar to the case of four pixels at the center of the pixel sharing unit shown in FIG. 22, respective pixels of the 1×4 pixels of the pixel sharing unit are coded with the same color filter by two pixels, as shown by the heavy line in FIG. 23. In other words, four pixels of the coding unit of the same color filter are configured to include pixels with no pixel sharing between each other. That is, four pixels of the coding unit of the same color filter are configured such that at least a half of the configuration is pixels of different pixel sharing units.

Thus, when a white point is generated in a black pixel portion at the center due to leakage of the floating diffusion or the like, the correction of green pixels indicated by a rhombus and an inverted triangle in the black pixel portion is performed using green pixels, which are indicated by a triangle and a circle, of the coding unit of the same green color filter.

That is, since pixels used in correction are adjacent pixels, the correction can be performed with spatially close data. Therefore, it is possible to suppress resolution degradation.

As described above, even when a pixel sharing unit is 1×4 pixels, it is possible to suppress resolution degradation in white point correction.

In addition, although the cases when the pixel sharing unit is 2×2 pixels, 2×4 pixels, and 1×4 pixels have been described above, the present technology can also be similarly applied to other pixel sharing units.

In addition, although the RGB checker color coding has been described above, the present technology can also be applied to RGBW including W as long as the same color coding is applied to four pixels. In addition, the present technology can also be applied to multicolor coding other than RGBW.

In addition, although the bottom surface emission type solid state imaging device has been described above, the present technology can also be applied to a top surface emission type solid state imaging device.

4. Fourth Embodiment

<Example of a Cross Section of a Solid State Imaging Device>

Figure 24:
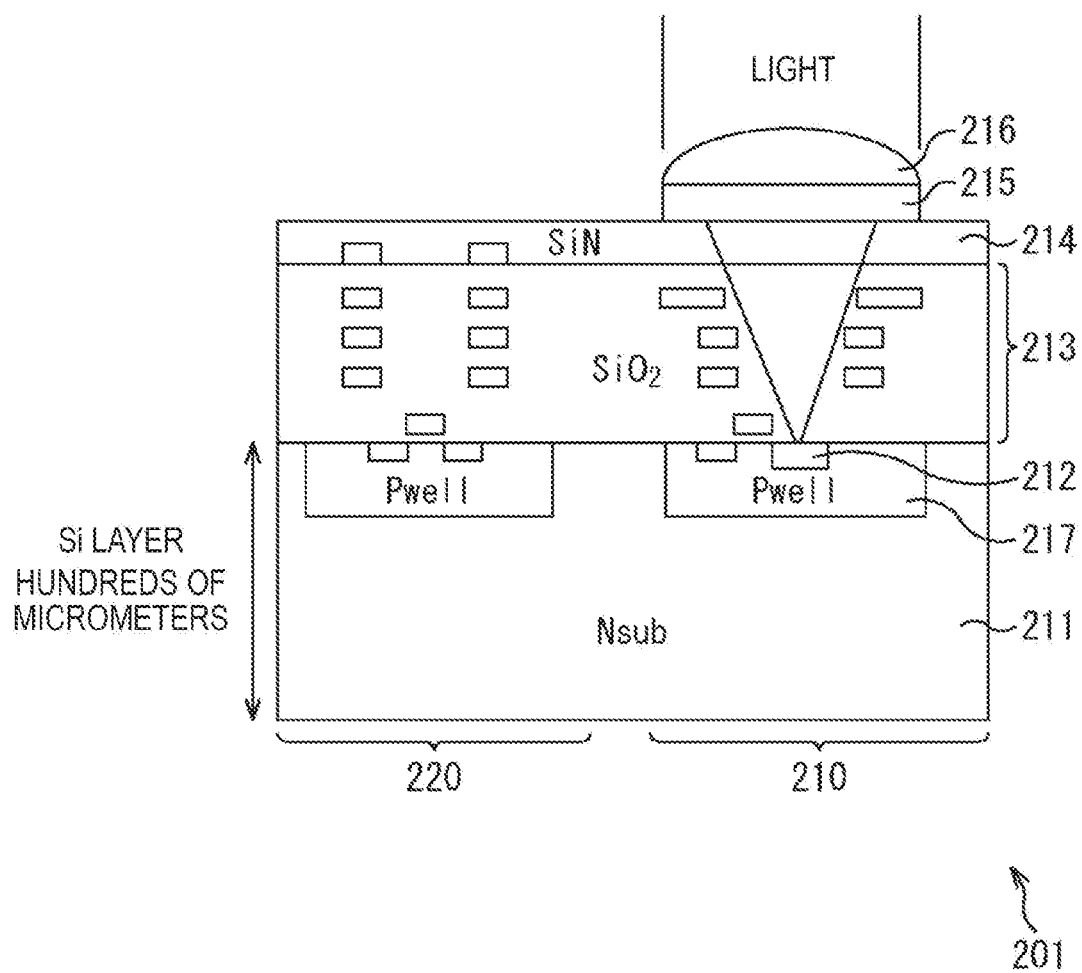
FIG. 24 is a cross-sectional view of a solid state imaging device according to another embodiment of the present technology.

FIG. 24 is a cross-sectional view showing an example of the structure of a pixel region and a peripheral circuit portion of the solid state imaging device of the present technology. In the example shown in FIG. 24, an example of a top surface emission type solid state imaging device is shown.

A solid state imaging device 201 in the example of FIG. 24 has a configuration in which a pixel region 210, which performs photoelectric conversion of incident light, and a peripheral circuit portion 220, which drives pixels to read a signal, performs signal processing on the read signal, and outputs the result, are integrated on the same chip (substrate). In addition, transistors forming the pixel region 210 and transistors forming the peripheral circuit portion 220 share some of their wiring lines. The pixel region 3 shown in FIG. 1 is applied as the pixel region 210.

The pixel region 210 has a structure in which a photodiode 212 is formed on the top surface side of an N-type silicon substrate 211 having a thickness of about hundreds of micrometers and a color filter 215 and an OCL (On Chip Lens) 216 are disposed above the photodiode 212 with a wiring layer 213 and a passivation layer 214 interposed therebetween. The color filter 215 is provided in order to obtain color signals. In addition, the color filter 35 shown in FIG. 2 is applied as the color filter 215.

In the pixel region 210, transistors or wiring lines are present between the photodiode 212 and the color filter 215. Accordingly, in order to increase the ratio of light incident on the photodiode 212 to light incident on the pixel region 210, that is, an aperture ratio, incident light is condensed to the photodiode 212 by the OCL 216 after passing between the wiring lines.

Similar to the solid state imaging device 1, the solid state imaging device 201 has the above-described relationship for the coding unit of the color filter 215 and the pixel sharing unit. Therefore, since white correction can be performed with spatially close data, it is possible to suppress resolution degradation.

In addition, the present technology is not limited to being applied to a solid state imaging device, such as an image sensor, for example. That is, the present technology can be applied to all kinds of electronic apparatuses in which a solid state imaging device is used as an image capturing unit (photoelectric conversion unit), such as imaging apparatuses involving a digital still camera and a video camera, a portable terminal apparatus having an imaging function, and a copy machine in which a solid state imaging device is used as an image reading unit.

5. Fifth Embodiment

<Example of the Configuration of a Computer>

The series of processing described above may be executed by hardware or may be executed by software. When executing the series of processing using software, a program of the software is installed on the computer.

Here, examples of the computer include a computer built into the dedicated hardware and a general-purpose personal computer capable of executing various functions by installing various programs.

Figure 25:
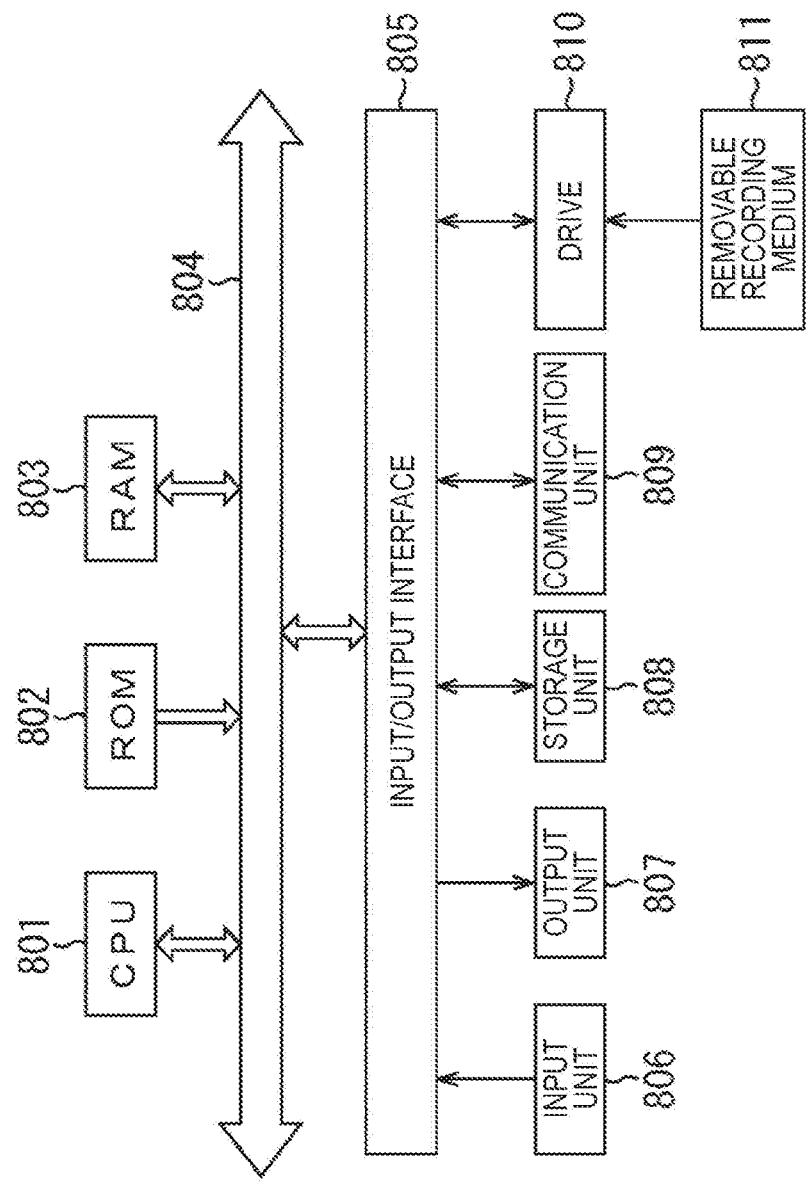
FIG. 25 is a block diagram showing an example of the configuration of a computer.

FIG. 25 is a block diagram showing an example of the hardware configuration of a computer that executes the series of processing described above using a program.

In a computer 800, a CPU (Central Processing Unit) 801, a ROM (Read Only Memory) 802, and a RAM (Random Access Memory) 803 are connected to each other by a bus 804.

An input/output interface 805 is connected to the bus 804. An input unit 806, an output unit 807, a storage unit 808, a communication unit 809, and a drive 810 are connected to the input/output interface 805.

The input unit 806 is configured to include a keyboard, a mouse, a microphone, and the like. The output unit 807 is configured to include a display, a speaker, and the like. The storage unit 808 is configured to include a hard disk, a nonvolatile memory, and the like. The communication unit 809 is configured to include a network interface and the like. The drive 810 drives a removable recording medium 811, such as a magnetic disk, an optical disc, a magneto-optical disc, or a semiconductor memory.

In the computer configured as described above, for example, the CPU 801 loads a program stored in the storage unit 808 to the RAM 803 through the input/output interface 805 and the bus 804 and executes the program, thereby executing the series of processing described above.

The program executed by the computer 800 (CPU 801) can be provided by being recorded on the removable recording medium 811 as a package medium, for example. In addition, the program can be provided through a cable or wireless transmission medium, such as a local area network, the Internet, or digital satellite broadcasting.

The computer can install the program in the storage unit 808 through the input/output interface 805 by mounting the removable recording medium 811 in the drive 810. In addition, the program can be installed in the storage unit 808 after being received by the communication unit 809 through a cable or wireless transmission medium. In addition, the program can be installed in advance in the ROM 802 or the storage unit 808.

In addition, the program executed by a computer may be a program for performing a process in a time-series manner in the order described in this specification, or may be a program for performing a process in parallel or at necessary timing, such as when a call is made.

In addition, in this specification, steps describing a program recorded on a recording medium include not only a process performed in a time-sequential manner according to the described order but also a process performed in parallel or separately even if not necessarily performed in a time-sequential manner.

In addition, in this specification, a system indicates the entire apparatus formed by a plurality of devices.

In addition, embodiments of the present disclosure are not limited to the above-described embodiments, and various modifications can also be made without departing from the spirit and scope of the present disclosure.

In addition, each step described in the above flowchart may be executed by one device or may be executed so as to be shared by a plurality of devices.

In addition, when a plurality of processes are included in one step, the plurality of processes included in one step may be executed by one device or may be executed so as to be shared by a plurality of devices.

In addition, the component described above as one device (or processing unit) may be divided into a plurality of devices (or processing units). Alternatively, the components described above as a plurality of devices (or processing units) may be integrated into one device (or processing unit). In addition, it is needless to say that each device (or each processing unit) may be configured to include components other than those described above. In addition, as long as the configuration or operation as the entire system is substantially the same, a part of the configuration of a certain device (or processing unit) may be included in the configuration of another device (or another processing unit). That is, the present technology is not limited to the embodiments described above, and various changes can be made without departing from the scope of the present technology.

While the preferred embodiments of the present disclosure have been described in detail with reference to the accompanying diagrams, the present disclosure is not limited to such examples. It is apparent to those skilled in the art that various changes and modifications can be made within the range of the technical idea disclosed in the appended claims, and it should undoubtedly be understood that they also belong to the technical range of the present disclosure.

In addition, the present technology can take the following configurations.

(1) A solid state imaging device, including:
a group of a plurality of pixels configured to include pixels of the same color coding and with no pixel sharing between each other; and
a color filter that is formed by Bayer arrangement of the group of a plurality of pixels.

(2) The solid state imaging device according to (1), wherein the group of a plurality of pixels includes pixels with no pixel sharing between each other.

(3) The solid state imaging device according to (1) or (2), wherein a unit of the pixel sharing is 2×2 pixels.

(4) The solid state imaging device according to (1), wherein at least a half of the group of a plurality of pixels is pixels with no pixel sharing between each other.

(5) The solid state imaging device according to (1) or (4), wherein a unit of the pixel sharing is 2×4 pixels.

(6) The solid state imaging device according to (1) or (4), wherein a unit of the pixel sharing is 1×4 pixels.

(7) The solid state imaging device according to any of (1) to (6),
wherein a defective pixel generated in a unit of the pixel sharing is corrected using pixels in the group of a plurality of pixels.

(8) The solid state imaging device according to any of (1) to (7),
wherein the group of a plurality of pixels includes four pixels.

(9) The solid state imaging device according to any of (1) to (8),
wherein the color coding is a coding of primary color checker.

(10) The solid state imaging device according to any of (1) to (8),
wherein the color coding is a coding of WRGB.

(11) A signal processing device, including:
a correction processing unit that corrects a defective pixel generated in a pixel sharing unit, in an output signal output from a solid state imaging device including a group of a plurality of pixels configured to include pixels of the same color coding and with no pixel sharing between each other and a color filter formed by Bayer arrangement of the group of a plurality of pixels, using pixels in the group of a plurality of pixels.

(12) The solid state imaging device according to (11), wherein the correction processing unit corrects a defective pixel generated in the pixel sharing unit using pixels in the group of a plurality of pixels according to the number of defective pixels generated in the pixel sharing unit.

(13) The solid state imaging device according to (11), wherein the correction processing unit corrects a defective pixel generated in the pixel sharing unit using all pixels in the group of a plurality of pixels.

(14) The solid state imaging device according to (11), wherein the correction processing unit corrects a defective pixel generated in the pixel sharing unit using data in the group of a plurality of pixels according to storage time of the defective pixel generated in the pixel sharing unit.

(15) An electronic apparatus, including:

a solid state imaging device that includes a group of a plurality of pixels configured to include pixels of the same color coding and with no pixel sharing between each other and a color filter formed by Bayer arrangement of the group of a plurality of pixels;

an optical system that makes incident light be incident on the solid state imaging device; and a signal processing circuit that processes an output signal output from the solid state imaging device.

REFERENCE SIGNS LIST

1 Solid state imaging device
2 Pixel
3 Pixel region
100 Camera apparatus
101 Optical unit
103 DSP circuit
104 Frame memory
151 Defective pixel address memory
152 Pixel determination section
153 Memory section
154 Correction processing section
171 Pixel determination section
191 Storage time memory
192 Pixel determination section
201 Solid state imaging device

What is claimed is:

1. An imaging device, comprising:
   a first photodiode and a first transfer transistor coupled to the first photodiode;
   a second photodiode and a second transfer transistor coupled to the second photodiode;
   a third photodiode and a third transfer transistor coupled to the third photodiode;
   a fourth photodiode and a fourth transfer transistor coupled to the fourth photodiode;
   a fifth photodiode and a fifth transfer transistor coupled to the fifth photodiode;
   a sixth photodiode and a sixth transfer transistor coupled to the sixth photodiode;
   a seventh photodiode and a seventh transfer transistor coupled to the seventh photodiode;
   an eighth photodiode and an eighth transfer transistor coupled to the eighth photodiode;
   a first floating diffusion coupled to the first, second, third, and fourth transfer transistors;
   a second floating diffusion coupled to the fifth, sixth, seventh, and eighth transfer transistors; and
   an amplification transistor coupled to the first and second floating diffusions,
   wherein the first third, sixth, and eighth photodiodes are configured to receive a light with a first spectrum,
   wherein the second and fourth photodiodes are configured to receive a light with a second spectrum which is different from the first spectrum,
   wherein the fifth and seventh photodiodes are configured to receive a light with a third spectrum which is different from the first and second spectrum, and
   wherein the first, third, fifth, and seventh photodiodes are in a first column of photodiodes, and wherein the second, fourth, sixth, and eighth photodiodes are in a second column of photodiodes.

2. The imaging device according to claim 1, wherein the light with the first spectrum is green light.

3. The imaging device according to claim 1, wherein the light with the second spectrum is red light.

4. The imaging device according to claim 1, wherein the light with the third spectrum is blue light.

5. The imaging device according to claim 1, wherein the light with the first spectrum is green light, wherein the light with the second spectrum is red light, and wherein the light with the third spectrum is blue light.

6. The imaging device according to claim 1, wherein each photodiode is associated with one of a plurality of color filters.

7. The imaging device of claim 1, wherein the first and second photodiodes are in a first row of photodiodes, wherein the third and fourth photodiodes are in a second row of photodiodes, wherein the fifth and sixth photodiodes are in a third row of photodiodes, and wherein the seventh and eighth photodiodes are in a fourth row of photodiodes.

8. The imaging device of claim 7, wherein the amplification transistor is located between the second and third rows of photodiodes.

9. The imaging device of claim 8, further comprising a reset transistor, wherein the reset transistor is located adjacent the first row of photodiodes.

10. The imaging device according to claim 1, wherein first and second floating diffusions are coupled to a gate of the amplification transistor.

11. The imaging device according to claim 1, wherein the first, second, third, and fourth transfer transistors are connected between the cathodes of their respective photodiodes and the first floating diffusion, and wherein the fifth, sixth, seventh, and eighth transfer transistors are connected between the cathodes of their respective photodiodes and the second floating diffusion.

12. The imaging device according to claim 11, wherein the amplification transistor has a gate electrode that is connected to the first and second floating diffusions.

13. The imaging device according to claim 1, wherein a defective pixel corresponding to one of the first through eighth photodiodes is corrected using a ninth photodiode.

14. The imaging device according to claim 13, wherein the defective pixel has a color filter of a first color, and wherein the ninth photodiode has a color filter of the first color.

15. The imaging device according to claim 14, wherein the one of the first through eight photodiodes corresponding to the defective pixel is coupled to the first or second floating diffusion through a corresponding transfer transistor, and wherein the ninth photodiode is coupled to a third floating diffusion through a ninth transfer transistor.

16. An electronic apparatus, comprising:
   an imaging device, comprising:
      a first photodiode and a first transfer transistor coupled to the first photodiode;
      a second photodiode and a second transfer transistor coupled to the second photodiode;
      a third photodiode and a third transfer transistor coupled to the third photodiode;
      a fourth photodiode and a fourth transfer transistor coupled to the fourth photodiode;
      a fifth photodiode and a fifth transfer transistor coupled to the fifth photodiode;
      a sixth photodiode and a sixth transfer transistor coupled to the sixth photodiode;

a seventh photodiode and a seventh transfer transistor coupled to the seventh photodiode;

an eighth photodiode and an eighth transfer transistor coupled to the eighth photodiode;

a first floating diffusion coupled to the first, second, third, and fourth transfer transistors;

a second floating diffusion coupled to the fifth, sixth, seventh, and eighth transfer transistors; and an amplification transistor coupled to the first and second floating diffusions, wherein the first, third, sixth, and eighth photodiodes are configured to receive a light with a first spectrum, wherein the second and fourth photodiodes are configured to receive a light with a second spectrum which is different from the first spectrum, wherein the fifth and seventh photodiodes are configured to receive a light with a third spectrum which is different from the first and second spectrum and wherein the first, third, fifth, and seventh photodiodes are in a first column of photodiodes, and wherein the second, fourth, sixth, and eighth photodiodes are in as second column of photodiodes;

an optical system, wherein light from the optical system is incident on the imaging device; and a signal processing circuit that processes an output signal output from the imaging device.

17. An imaging device, comprising:

a first photodiode and a first transfer transistor coupled to the first photodiode;

a second photodiode and a second transfer transistor coupled to the second photodiode;

a third photodiode and a third transfer transistor coupled to the third photodiode;

a fourth photodiode and a fourth transfer transistor coupled to the fourth photodiode;

a fifth photodiode and a fifth transfer transistor coupled to the fifth photodiode;

a sixth photodiode and a sixth transfer transistor coupled to the sixth photodiode;

a seventh photodiode and a seventh transfer transistor coupled to the seventh photodiode;

an eighth photodiode and an eighth transfer transistor coupled to the eighth photodiode;

a first floating diffusion coupled to the first, second, third, and fourth transfer transistors;

a second floating diffusion coupled to the fifth, sixth, seventh, and eighth transfer transistors; and an amplification transistor coupled to the first and second floating diffusions, wherein the first, third, sixth, and eighth photodiodes are configured to receive a light with a first spectrum, wherein the second and fourth photodiodes are configured to receive a light with a second spectrum which is different from the first spectrum, wherein the fifth and seventh photodiodes are configured to receive a light with a third spectrum which is different from the first and second spectrum, and wherein a defective pixel corresponding to one of the first through eighth photodiodes is corrected using a ninth photodiode.

18. The imaging device according to claim 17, wherein the defective pixel has a color filter of a first color, and wherein the ninth photodiode has a color filter of the first color.

19. The imaging device according to claim 18, wherein the one of the first through eight photodiodes corresponding to the defective pixel is coupled to the first or second floating diffusion through a corresponding transfer transistor, and wherein the ninth photodiode is coupled to a third floating diffusion through a ninth transfer transistor.

20. The imaging device according to claim 18, wherein each photodiode is associated with one of a plurality of color filters.

* * * * *